(12) United States Patent
Mallett

(10) Patent No.: US 9,935,646 B2
(45) Date of Patent: Apr. 3, 2018

(54) SYSTEMS AND METHODS FOR IDENTIFYING A FAILURE IN AN ANALOG TO DIGITAL CONVERTER

(71) Applicant: Schweitzer Engineering Laboratories, Inc., Pullman, WA (US)

(72) Inventor: Travis C. Mallett, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 260 days.

(21) Appl. No.: 14/802,787

(22) Filed: Jul. 17, 2015

(65) Prior Publication Data

US 2017/0019120 A1    Jan. 19, 2017

(51) Int. Cl.
H03M 1/10    (2006.01)
H03M 3/00    (2006.01)
G06F 11/00   (2006.01)

(52) U.S. Cl.
CPC ........... *H03M 1/1076* (2013.01); *G06F 11/00* (2013.01); *H03M 1/109* (2013.01); *H03M 1/1071* (2013.01); *H03M 3/378* (2013.01); *H03M 3/458* (2013.01)

(58) Field of Classification Search
CPC .... H03M 1/1076; H03M 1/109; H03M 3/378; H03M 3/458
USPC .......................................... 341/120; 324/537
See application file for complete search history.

(56) References Cited

U.S. PATENT DOCUMENTS

| | | | |
|---|---|---|---|
| 4,470,303 A | 9/1984 | O'Donnell | |
| 4,795,963 A | 1/1989 | Ueno | |
| 5,132,685 A | 7/1992 | DeWitt | |
| 5,146,202 A | 9/1992 | Kashihara | |
| 5,151,866 A | 9/1992 | Glaser | |
| 6,515,476 B1 | 2/2003 | Oshio | |
| 6,972,700 B2 | 12/2005 | Kanekawa | |
| 7,154,422 B2 | 12/2006 | Wen | |
| 7,176,816 B2 | 2/2007 | Koerner | |
| 7,286,068 B2 | 10/2007 | Stanley | |
| 7,557,572 B1 | 7/2009 | Hertz | |
| 7,728,575 B1 | 6/2010 | Ozalevli | |

(Continued)

OTHER PUBLICATIONS

Siemens, Siprotec 5: Modular Hardware Design, 03 Hardware Overview SIPROTEC 5/DIGSI 5 Basic Course, Siemens Power Academy TD, Version: D_02_Page 26, Jan. 2012.

(Continued)

*Primary Examiner* — Patrick Assouad
*Assistant Examiner* — Khristopher Yodichkas
(74) *Attorney, Agent, or Firm* — Justin K. Flanagan; Richard M. Edge

(57) ABSTRACT

The present disclosure provides systems and methods for identifying failures in an analog to digital (A/D) converter. An intelligent electronic device (IED) may monitor a digital output of one or more A/D converters. The IED may determine a slope value limit associated with the A/D converter. The IED may determine an output slope value of the digital output based on a difference of a converter output value measured at a first time and a converter output value measured at a later time. If the determined output slope value exceeds the slope value limit, the IED may identify a failure of the A/D converter. An IED may determine that concurrent failures in multiple, parallel A/D converters are indicative of a problem upstream from the A/D converters.

23 Claims, 16 Drawing Sheets

(56) References Cited

U.S. PATENT DOCUMENTS

| | | |
|---|---|---|
| 8,330,437 B1 | 12/2012 | Hartman |
| 8,736,468 B2 | 5/2014 | Fabregas |
| 8,756,029 B2 | 6/2014 | Bandsmer |
| 9,564,914 B1 | 2/2017 | Mallett |
| 9,584,148 B1 | 2/2017 | Mallett |
| 9,698,809 B1 | 7/2017 | Mallett |
| 9,787,317 B2 | 10/2017 | Mallett |
| 2004/0163017 A1 | 8/2004 | Koga |
| 2005/0038623 A1 | 2/2005 | Hammerschmidt |
| 2007/0236239 A1 | 10/2007 | Bucksch |
| 2007/0288832 A1 | 12/2007 | Adachi |
| 2010/0164764 A1* | 7/2010 | Nayak .............. G11B 20/10009 341/118 |
| 2013/0106632 A1 | 5/2013 | Petigny |
| 2013/0169456 A1 | 7/2013 | Cheong |
| 2013/0293402 A1 | 11/2013 | Naudet |
| 2013/0297575 A1 | 11/2013 | Fallon |
| 2017/0207792 A1 | 7/2017 | Mallett |

OTHER PUBLICATIONS

Etzel, M.; Jenkins, W., "Redundant residue number systems for error detection and correction in digital filters," Acoustics, Speech and Signal Processing, IEEE Transactions on , vol. 28, No. 5, pp. 538,545, Oct. 1980. URL: http://ieeexplore.ieee.org/stamp/stamp.jsp?tp=&arnumber=1163442&isnumber=26148.

Singh, M.; Koren, I., "Fault-sensitivity analysis and reliability enhancement of analog-to-digital converters," Very Large Scale Integration (VLSI) Systems, IEEE Transactions on , vol. 11, No. 5, pp. 839,852, Oct. 2003. URL: http://ieeexplore.ieee.org/stamp/stamp.jsp?tp=&arnumber=1234403&isnumber=27663.

Willsky, Alan S. "A survey of design methods for failure detection in dynamic systems." Automatica 12.6 (1976): 601-611. URL: http://www.sciencedirect.com/science/article/pii/0005109876900418.

* cited by examiner

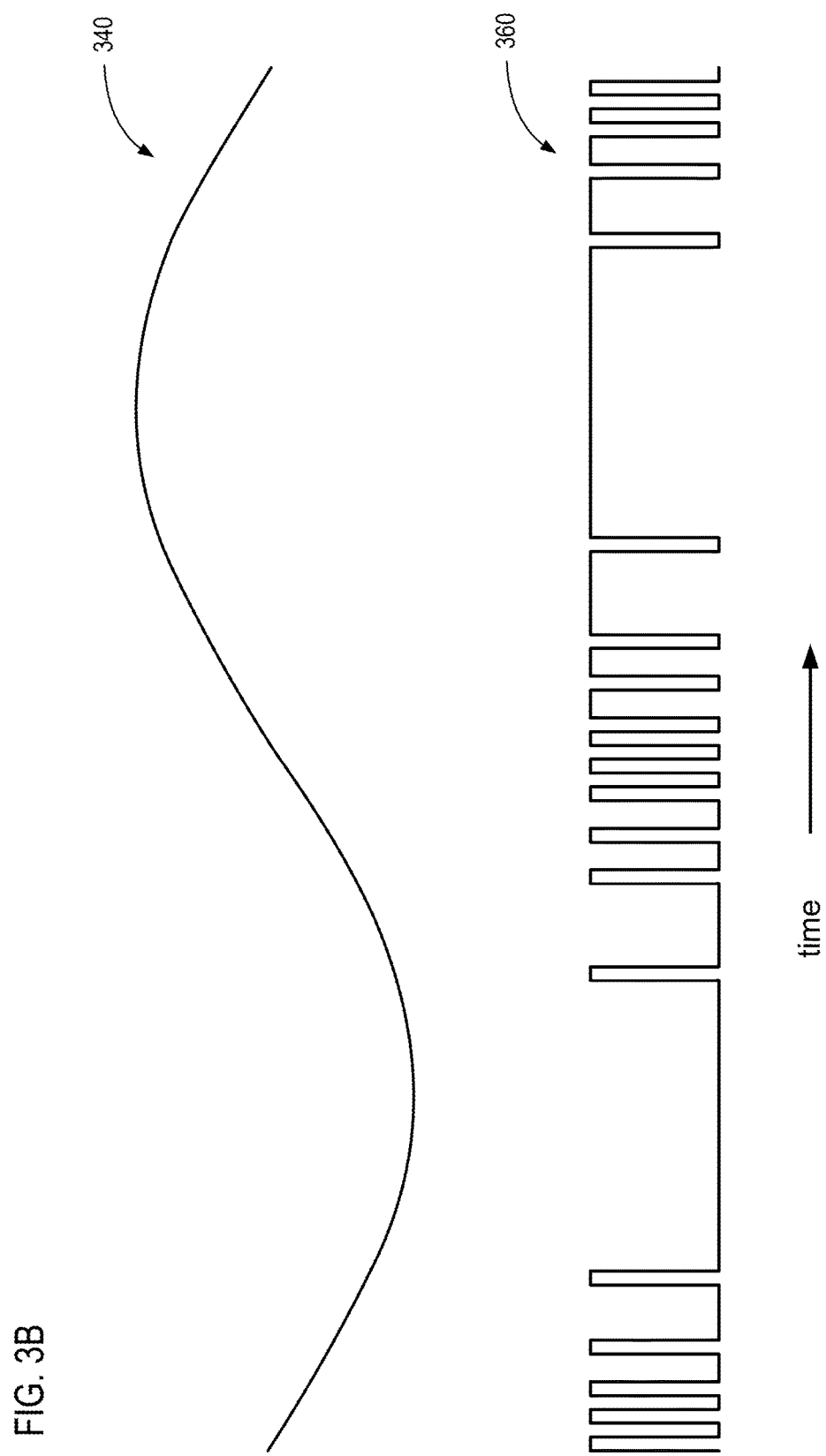

FIG. 8A

| N→<br>M↑ | 2 | 4 | 8 | 16 | 32 | 64 | 128 | 256 | 512 | 1024 | 2048 | 4096 |
|---|---|---|---|---|---|---|---|---|---|---|---|---|
| 1 | 1 | 1 | 1 | 1 | 1 | 1 | 1 | 1 | 1 | 1 | 1 | 1 |
| 2 | 1 | 0.875 | 0.8125 | 0.78125 | 0.765625 | 0.7578125 | 0.75390625 | 0.751953125 | 0.750976563 | 0.750488281 | 0.750244141 | 0.750122207 |
| 3 | 0.75 | 0.6875 | 0.671875 | 0.66796875 | 0.666992188 | 0.666748047 | 0.666687012 | 0.666671753 | 0.666667938 | 0.666666985 | 0.666666746 | 0.666666687 |
| 4 | 0.875 | 0.7265625 | 0.660644331 | 0.629333496 | 0.614403656 | 0.606471062 | 0.600270822 | 0.600831673 | 0.599894604 | 0.599426369 | 0.599192326 | 0.599075324 |
| 5 | 0.625 | 0.5664062.5 | 0.553955038 | 0.550979614 | 0.550244331 | 0.550061047 | 0.550015261 | 0.550003815 | 0.550000954 | 0.550000238 | 0.550000006 | 0.550000015 |
| 6 | 0.78125 | 0.633839375 | 0.568099976 | 0.538951397 | 0.524846539 | 0.517901457 | 0.514454557 | 0.512737371 | 0.511880326 | 0.511452188 | 0.511238215 | 0.511131252 |
| 7 | 0.546875 | 0.493896484 | 0.482875824 | 0.480235517 | 0.479582242 | 0.479419342 | 0.479378643 | 0.479368477 | 0.479365927 | 0.479365291 | 0.479365132 | 0.479365093 |
| 8 | 0.7109375 | 0.56463623 | 0.505711436 | 0.47866804 | 0.465643798 | 0.459246471 | 0.456074936 | 0.454495771 | 0.453703829 | 0.453314263 | 0.453117582 | 0.453019267 |
| 9 | 0.4921875 | 0.443664551 | 0.43361789 | 0.431211153 | 0.430615705 | 0.430467227 | 0.430430132 | 0.430418542 | 0.430417962 | 0.430417962 | 0.430417817 | 0.430417781 |
| 10 | 0.65625 | 0.515550613 | 0.460142687 | 0.434897748 | 0.422779823 | 0.416835204 | 0.413890105 | 0.412424193 | 0.411692875 | 0.411327624 | 0.4111451 | 0.411053863 |

FIG. 8B

| n | h[n] | $\left.\dfrac{dV}{dt}\right|_{t=n}$ | $\left.\dfrac{dV}{dt}\right|_{t=n-1}$ | $\sqrt{\left(\left.\dfrac{dV}{dt}\right|_{t=n}\right)^2 + \left(\left.\dfrac{dV}{dt}\right|_{t=n-1}\right)^2}$ ⟵ 810 |
|---|---|---|---|---|
| 0 | 0 | 0 | 0 | |
| 1 | 3.8147E-06 | 0.182731628 | 3.8147E-06 | 3.8147E-06 |
| 2 | 0.182727814 | 0.848514557 | 0.182727814 | 0.182727814 |
| 3 | 0.848514557 | 0.665782928 | 0.690403043 | |
| 4 | 1 | 0.151485443 | 0.6827992 | |

_US 9,935,646 B2_

SYSTEMS AND METHODS FOR IDENTIFYING A FAILURE IN AN ANALOG TO DIGITAL CONVERTER

TECHNICAL FIELD

This disclosure relates to validation and measurement systems and methods in electric power delivery systems. More particularly, this disclosure relates to systems and methods for identifying a failure in an analog to digital converter.

BRIEF DESCRIPTION OF THE DRAWINGS

Non-limiting and non-exhaustive embodiments of the disclosure are described herein, including various embodiments of the disclosure with reference to the figures listed below.

FIG. 3B illustrates an analog input signal sampled by a delta-sigma modulator of a delta-sigma analog to digital converter and a corresponding digital output, according to one embodiment.

FIG. 8A illustrates a table of a plurality of maximum values shown in percent full-scale, according to one embodiment.

FIG. 8B illustrates a table of several time values, step response values, derivative values, and magnitude calculations according to one embodiment.

Figure 1:
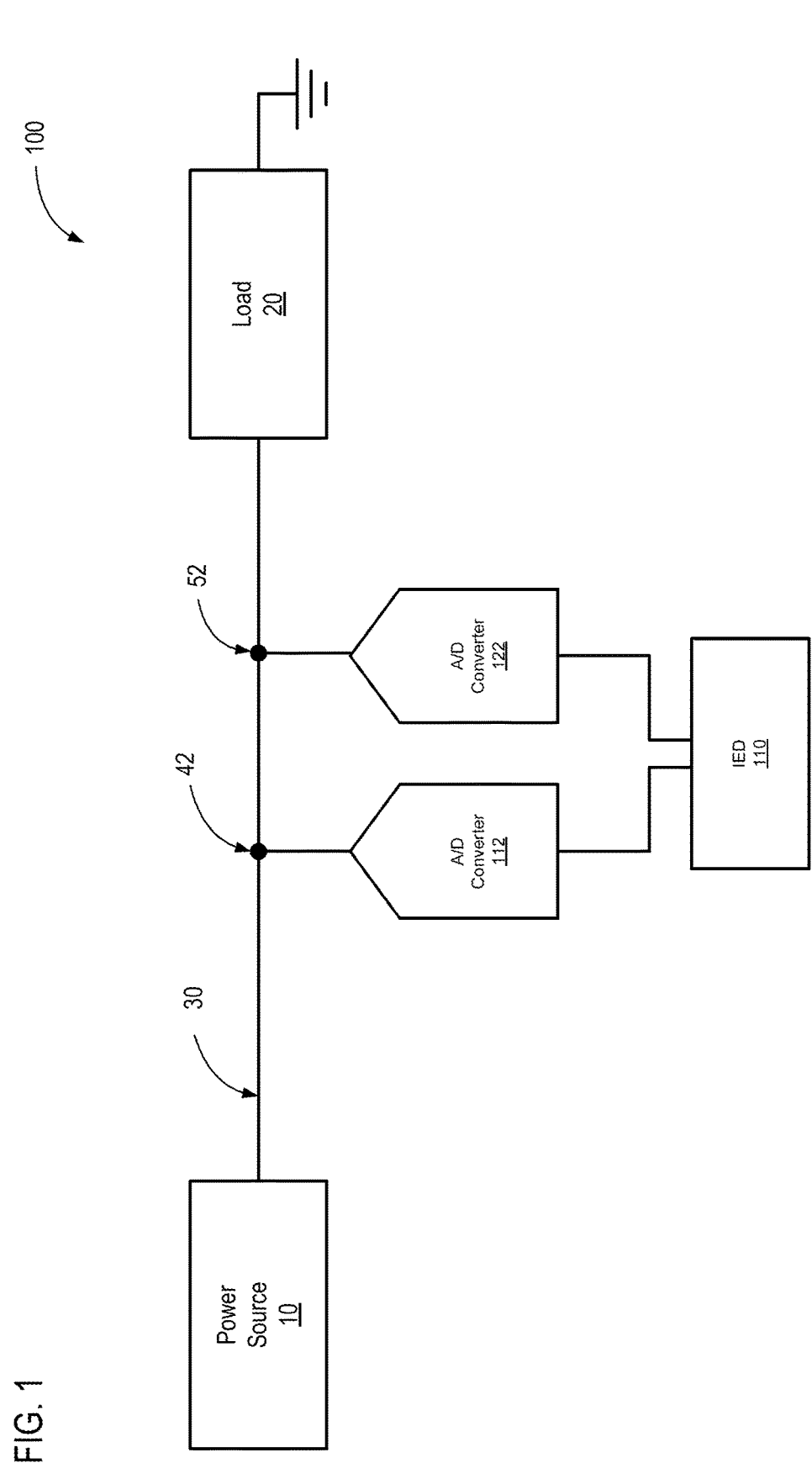
FIG. 1 illustrates a simplified diagram of a power delivery system and a corresponding monitoring system, according to one embodiment.

In the following description, numerous specific details are provided for a thorough understanding of the various embodiments disclosed herein. The systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

Protection relays may be installed in electric power generation, transmission, and distribution facilities to detect overloads, short circuits, and other fault conditions. For example, large amounts of current may flow through a power line into a ground or other shorting medium in response to one or more short circuit faults. A protective relay may be configured to detect a fault condition (e.g. a short circuit fault) based on an overcurrent element associated with a specific amount of current and may trip a breaker, clearing the fault. In some embodiments, protective relays may be deemed "mission critical" equipment for the integrity of the power system and personal safety of the users and operators. In many embodiments and configurations of a protective relay, the reliability and proper function of a protective relay may be of utmost concern.

Many embodiments of a protective relay are electronic devices employing FPGAs, microcontrollers, CPUs, analog to digital (A/D) converters, electronic displays, communication ports, and other electronic devices and systems to digitize power system currents and/or voltages and/or process data associated with the digitized currents and voltages according to various algorithms and/or digital filters. A protective relay may be configured to make protection decisions based on data associated with a digitized power system currents and/or voltages, and may communicate decisions made by a protective relay to an appropriate system or personnel, and/or may otherwise cause a suitable response to the digitized power system currents and/or voltages.

While the reliability of many essential electronic devices and systems in a protective relay have been thoroughly investigated, decisions made by a protective relay may only be as reliable as any digitized current and/or voltage data communicated to the protective relay from an A/D converter. If an A/D converter communicates false or inaccurate information to a protective relay without any indication of one or more errors associated with the communicated information, the protective relay may act based on the received false or inaccurate data, and may cause unintended consequences known as an "unintended operation" (UO).

A high-precision A/D converter may include an oversampling A/D converter, such as a delta-sigma A/D converter. An oversampling A/D converter may contain integrated digital filters. Errors associated with an output of an oversampling A/D converter may be detected by comparing data associated with the output of an oversampling A/D converter with determined limiting characteristics and behaviors associated with the A/D converter and/or with a filter (i.e. an analog or digital filter). Any data associated with an output of an A/D converter that does not conform to or that exceeds one or more limiting characteristics may be detected and/or reported as a failure or error to any suitable device. Thus, the protective relay may ignore data associated with one or more errors reported to the protective relay, disable one or more protection elements, or implement other appropriate actions to prevent, restrict, or limit an UO.

Intelligent electronic devices (IEDs) may be used for monitoring, protecting, and/or controlling industrial and utility equipment, such as in electric power delivery systems. IEDs within a power system may be configured to perform metering, control, and protection functions that require a certain level of accuracy. Further, IEDs may be configured to obtain measurement information from A/D converters, and may be configured to identify any potential failures of an A/D converter from which the IED is receiving data. Specifically, the output of measurement devices, such as over-sampling A/D converters may be monitored and/or validated on a regular basis to ensure that they are functioning correctly and/or that any failure of an A/D converter is identified and reported.

An IED may be in communication with one or more A/D converters. The IED may collect a first set of measurement data from a first A/D converter, and may simultaneously or approximately simultaneously collect a second set of measurement data from a second A/D converter. An A/D converter may sample an input signal at a frequency that is greater than the frequency of the input signal. A/D converters may sample an input signal at a frequency that is two or more times greater than the frequency of the input signal. One embodiment of a suitable A/D converter is an over-sampling A/D converter such as a delta-sigma A/D converter.

An IED may be configured to monitor the operation of two or more A/D converters. Specifically, the IED may collect measurement data obtained by a first A/D converter from one phase of power. The IED may collect measurement data obtained by a second A/D converter from the same phase of power.

The collected measurement data from the first A/D converter may be time-aligned with the collected measurement data from the second A/D converter. The first and second A/D converters may utilize a parallel input configuration to inherently time-synchronize their outputs to the IED. While in a parallel input configuration, the first and second A/D converters may be configured to sample the phase of power at the same or substantially similar electrical position along the length of the transmission line.

Digital outputs of the first and second A/D converters may be coupled to the IED. The first and second A/D converters may sample a voltage or current of one or more transmission lines, and may output digital data streams associated with the sampled voltage/current as digital inputs to the IED.

The IED may utilize a common time source, such as a time signal provided by a global positioning system (GPS) or via a time-syncing standard such as IEEE 1588 to time-align the collected measurement data. Accordingly, the IED may be time-aligned to allow for synchrophasors to be calculated. Additionally, the IED may utilize identical or similar sampling and processing algorithms for the collected measurement data of the first and second A/D converters to further facilitate the calculations of accurate synchrophasors.

However, in many situations, the IED may utilize unsynchronized time signals and/or alternative sampling and processing algorithms for the collected data of the first and second A/D converters. In some embodiments, two A/D converters may be different models or and/or utilize independent time signals. In such embodiments, the data collected may not be inherently time-aligned. If different model A/D converters are used and/or the converters are not time-aligned, then an event trigger common to both A/D converters may be used to align the measurement data from each converter. For example, each A/D converter may be configured to begin collecting data when a power system event or anomaly is detected, such as when an overcurrent is detected.

The IED may be the only IED that is configured to monitor a particular A/D converter. In other embodiments, the input of the single IED may be time-synchronized with some synchronous signal as described above. In still other embodiments, two or more IEDs may be configured to monitor the same A/D converter. The collected measurement data of the two or more IEDs may be synchronized according to the methods, standards, and/or signals described previously.

With the measurement data from each A/D converter time-aligned, the IED may determine via a meter, a first output voltage for each A/D converter at a time corresponding to a common event trigger. The IED may also determine a second output voltage for each A/D converter, at a time following the common event trigger. The calculated first output voltages and/or second output voltages for the measurement data collected by the IED should be approximately the same, since they are aligned with respect to one another using the common event trigger, and/or are collected from two A/D converters in a parallel electronic configuration. The collected measurement data corresponding to the first output voltage of the first and second A/D converters may be identical and/or significantly similar in magnitude. Similarly, the collected measurement data corresponding to the second output voltage of the first and second A/D converters may be identical and/or significantly similar in magnitude. However, the first and second voltage outputs of a single A/D converter, or the first and second voltage outputs of a first A/D converter in a dual A/D configuration, may be distinct. That is, the first and second voltage outputs may not be identical or significantly similar to one another in magnitude.

A slope value limit device or a slope value limit module may identify a slope value limit for each of the A/D converters. The identified slope value limit of a first A/D converter may correspond to a filter associated with the first A/D converter. Similarly, the identified slope value limit of a second A/D converter may correspond to a filter associated with the second A/D converter. A slope value limit of an A/D converter may correspond to any suitable value. A slope value limit may be configured to be indicative of an inherent feature of an analog or digital filter associated with the A/D converter. The slope value limit may be based on a maximum slope value of an over-sampling A/D converter output.

An output slope value module or device may determine an output slope value of the output of each A/D converter. An output slope value may be based on a difference of the first and second measured output voltages of an A/D converter. The difference of the first and second measured output voltages of an A/D converter may be determined according to any suitable method. For example, a first measured output voltage may be subtracted from a second measured output voltage of the same A/D converter.

A first measured output voltage of an A/D converter may be utilized with a second measured output voltage of another A/D converter to determine a difference of the first and second output voltages. The difference may be scaled by any suitable scaling quantity. For example, the difference may be divided by an amount based on the time between a first and a second measured output voltage. The resulting scaled difference may be configured to approximate an output slope value. The difference may be multiplied by a number, or divided by a number. The number may be based on an amount of time between the first and second measured output voltages.

A first measured output voltage of an A/D converter may be utilized with a plurality of consecutively measured output voltages of an A/D converter to determine a slope value or other suitable quantity indicative of a characteristic of a filter associated with the A/D converter. For example, the slope value may be the logarithm of the difference of three consecutive output voltage values. The slope value may be the square root of a scaled plurality of output voltage differences. The slope value may be any mathematical function of any number of output voltage values from an A/D converter.

A comparator module or device may compare the determined output slope values and the slope value limits of the first and second A/D converters. The comparator module may identify a failure of the first and/or second A/D converters, if the determined output slope values from the first and/or second A/D converters exceed one or more identified slope value limits. The determined output slope value may be less than the identified slope value limit of either the first or second A/D converter. The comparator module and/or device may be configured to identify a non-failure, or may indicate that no failure of either A/D converter has been identified.

A first IED and a second IED may function as primary and backup IEDs, respectively. The first IED and the second IED may function as dual-primary IEDs. Additionally, any number of IEDs may be used in conjunction with the validation systems and methods described herein. For example, three or four IEDs may be utilized to validate one another in a primary-backup combination or as a plurality of primary IEDs.

In some embodiments, a successive approximation register (SAR) A/D converter may be used. Further, a SAR A/D converter may include an analog Sallen-Key filter. The slope value limit device may determine a slope value limit based on a Sallen-Key filter (e.g., a step or impulse response of the Sallen-Key filter). In the embodiment, the Sallen-Key filter may be configured, included, and/or, monitored to determine a maximum slope value or slope value limit, in approximately the same manner as embodiments including an over-sampling A/D converter associated with a digital filter.

The systems and methods described herein may be expanded for use in an enterprise and/or industrial environment in which a validation module or validation device may be in communication with any number (i.e., hundreds or even thousands) of pairs of IEDs functioning in dual-primary or primary-backup configurations. Accordingly, a centralized validation system may be capable of remotely validating the functionality of measurement devices and/or IEDs throughout an electric power delivery system. Similarly, a validation module or validation device may be adapted to monitor and regularly validate the functionality of measurement devices and/or IEDs within a substation of an electric power delivery system.

The phrases "connected to" and "in communication with" refer to any form of interaction between two or more components, including mechanical, electrical, magnetic, and electromagnetic interaction. Two components may be connected to each other, even though they are not in direct contact with each other, and even though there may be intermediary devices between the two components.

As used herein, the term IED may refer to any device that monitors, controls, automates, and/or protects monitored equipment within a system (e.g., a microprocessor device). Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like. IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term IED may be used interchangeably to describe an individual IED or a system comprising multiple IEDs.

Some of the infrastructure that can be used with embodiments disclosed herein is already available, such as: general-purpose computers, computer programming tools and techniques, digital storage media, and communications networks. A computer may include a processor, such as a microprocessor, microcontroller, logic circuitry, or the like. The processor may include a special purpose processing device, such as an ASIC, PAL, PLA, PLD, Field Programmable Gate Array, or other customized or programmable device. The computer may also include a computer-readable storage device, such as non-volatile memory, static RAM, dynamic RAM, ROM, CD-ROM, disk, tape, magnetic, optical, flash memory, or other computer-readable storage medium.

Suitable networks for configuration and/or use, as described herein, include any of a wide variety of network infrastructures. Specifically, a network may incorporate landlines, wireless communication, optical connections, various modulators, demodulators, small form-factor pluggable (SFP) transceivers, routers, hubs, switches, and/or other networking equipment.

The network may include communications or networking software, such as software available from Novell, Microsoft, Artisoft, and other vendors, and may operate using TCP/IP, SPX, IPX, SONET, and other protocols over twisted pair, coaxial, or optical fiber cables, telephone lines, satellites, microwave relays, modulated AC power lines, physical media transfer, wireless radio links, and/or other data transmission "wires." The network may encompass smaller networks and/or be connectable to other networks through a gateway or similar mechanism.

Aspects of certain embodiments described herein may be implemented as software modules or components. As used herein, a software module or component may include any type of computer instruction or computer executable code located within or on a computer-readable storage medium. A software module may, for instance, comprise one or more physical or logical blocks of computer instructions, which may be organized as a routine, program, object, component, data structure, etc., that perform one or more tasks or implement particular abstract data types.

A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media. Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network.

The embodiments of the disclosure can be understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments. In other instances, well-known structures, materials, or operations are not shown or described in detail to avoid obscuring aspects of this disclosure. In addition, the steps of a method do not necessarily need to be executed in any specific order, or even sequentially, nor need the steps be executed only once, unless otherwise specified.

FIG. 1 is a diagram of a power delivery system 100, according to one embodiment. The power delivery system may include a power source 10, one or more transmission lines 30, a load 20, two or more A/D converters 112, 122, and an IED 110.

The power source 10 may be configured to be in electrical communication with the load 20 via the transmission lines 30 to deliver electric power. The power source 10 may be any suitable method and/or device for generating and/or providing electric power to one or more loads 20. For example, the power source 10 may be defined as the output ports of one or more transmission lines, the terminals of one or more batteries, one or more electric generators, or any other suitable method or device. The electric power provided by the power source 10 may include a voltage and a current. The power may be communicated from the power source 10 to a load 20 via one or more transmission lines 30.

The load 20 may be any suitable load, capable of receiving electric power from one or more electric power sources 10. The load 20 may be configured to couple with an electric power source 10 via one or more transmission lines 30, and may be in electric communication with the power source 10. The load 20 may include a real resistance, a complex impedance, and/or a positive/negative reactance, or any suitable combination thereof.

The system 100 may include two A/D converters 112,122 coupled with the transmission lines at points 42, 52. The system 100 may include any suitable number of A/D converters 112, 122. For example, some embodiments may include only one A/D converter 112. Other embodiments may include three or more A/D converters. The two A/D converters 112, 122 may be configured to sample a voltage at points 42, 52 of the transmission lines 30. For example, the A/D converters 112,122 may be configured to sample a voltage across a resistance to determine a current flowing through the transmission line 30.

The A/D converters 112,122 may be configured to sample a voltage and/or a current of the transmission lines 30 as an input signal of the A/D converters 112, 122. The A/D converters 112, 122 may be configured to sample an input signal at a sampling frequency two or more times greater than the frequency of the input signal.

The A/D converters 112, 122 may output a digital signal according to an amplitude of the sampled input signal at the input of the A/D converters 112, 122. An IED 110 may be configured to receive one or more digital outputs of the A/D converters 112, 122 and may be configured to notify and/or configure one or more devices and/or components of the system 100, based on the one or more digital signals output by the converters 112, 122.

The IED 110 may be configured to collect digital measurement data from the two A/D converters 112, 122. In some embodiments, more than one IED 110 may receive digital measurement data from the one or more A/D converters 112, 122. The IEDs 110 may be placed in a parallel configuration with the outputs of the converters 112, 122, so the IEDs 110 may receive identical digital data output from the A/D converters 112, 122. The IED 110 may be configured to collect and/or store the digital measurement data received from one or more A/D converters 112, 122. An IED 110 may be configured to utilize collected and/or stored digital measurement data of an A/D converter 112, 122 to identify a failure of an A/D converter 112, 122.

A single A/D converter 112 may be configured to sample a voltage of the transmission lines 30 and output a corresponding digital measurement signal to an IED 110. However, in other embodiments one or more A/D converters 112, 122 may sample the voltage of the transmission line 30 at a single point 42 or at two points 42, 52, and may output digital measurement signals to an IED 110.

The digital outputs of the two A/D converters 112, 122 may be utilized to identify a failure in one or more of the A/D converters 112, 122. An IED 110 may compare collected digital measurement data of a first A/D converter 112 with the collected digital measurement data of a second A/D converter 122 to facilitate verification of an identified failure of the first or second A/D converters 112, 122. When an IED 110 identifies one or more anomalies or errors in only one of the converters 112, 122 the corresponding A/D converter 112 may likely include a failure. However, when the collected digital measurement data causes an IED 110 to identify an anomaly or error in both A/D converters 112, 122 some other failure condition may exist within the IED 110, or may exist elsewhere in the power system 100.

Figure 2:
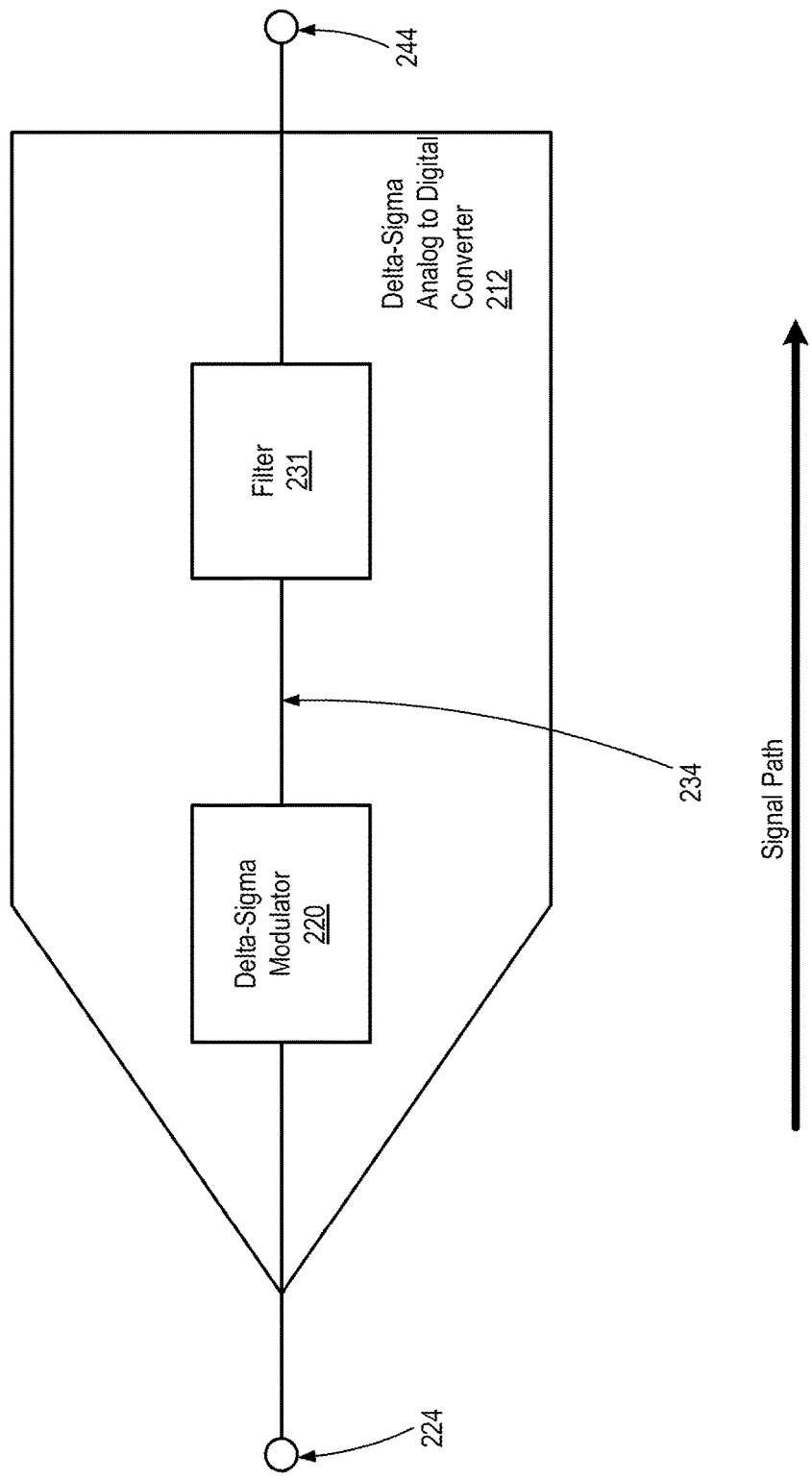
FIG. 2 illustrates a block diagram of a delta-sigma analog to digital converter, according to one embodiment.

FIG. 2 is a box diagram of a delta-sigma A/D converter 212, according to one embodiment. The delta-sigma A/D converter 212 may include a delta-sigma modulator 220 and a filter 231. The delta-sigma A/D converter 212 may produce a high-resolution data-stream output at an output terminal 244 according to an input signal sampled at the input terminal 224.

The delta-sigma modulator 220 may be configured to sample an input signal at an input terminal 224 of the delta-sigma A/D converter 212 at a fixed sampling frequency. The delta-sigma modulator 220 may also be configured to output a digital data stream at the terminal 234. The output digital data stream may be composed of one or more single bit values. The number of single bit values present in the digital data stream of the terminal 234 of the delta-sigma modulator 220 may be based on the amplitude of the input signal sampled at the input terminal 224.

The delta-sigma modulator 220 may output 32,000 single bit values per second. Other embodiments of the delta-sigma modulator 220 may output a digital data stream at a frequency greater than 32,000 single bit values per second. Still other embodiments may output a digital data stream at a lower frequency. The sampling frequency of a delta-sigma modulator 220 may be greater than the frequency at which the delta-sigma modulator 220 outputs a digital data stream corresponding to the sampled signal of the input terminal 224. The sampling frequency of a delta-sigma modulator 220 may be two or more times greater than the frequency of an input signal. In other embodiments, the sampling frequency of a delta-sigma modulator 220 may be at a lower frequency than an input signal.

A digital data stream of single bit values output by the delta-sigma modulator 220 may be stored in a computer readable storage medium. Other components of the A/D converter may access the stored data stream to shape and/or filter the data stream through one or more digital filters included in or associated with the filter 231. The filter 231 may be configured to filter a digital data stream stored in a computer readable storage medium as a digitally implemented filter 231, or as an equivalent analog filter 231. For any suitable filter 231 configuration, the filter 231 may receive and shape the output of the delta-sigma modulator 220 based on a step response of the filter 231.

The filter 231 of the delta-sigma A/D converter 212 may shape a digital data stream by removing, altering, shaping, or attenuating one or more bit values (e.g., single bit values, two bit values, three bit values) of the digital data stream. The delta-sigma A/D converter 212 may shape a digital data stream by attenuating and/or removing particular single bit values of the one or more single bit values corresponding to a sampled input signal. For example, the filter 231 may shape a digital data stream by attenuating and/or removing a reoccurring bit value position corresponding to a configuration of the filter 231. The filter 231 may also be configured to count a certain number of bit value positions within the digital data stream, and alter and/or remove a single bit value corresponding to a certain number in the count of one bit value positions of the digital data stream.

The delta-sigma A/D converter 212 may store the output of a delta-sigma modulator 220 in a computer readable storage medium. The delta-sigma A/D converter 212 may be configured to store each individual one bit value of one bit data stream output by the delta-sigma modulator 220 in a computer readable storage medium as the digital data stream is output by the delta-sigma modulator 220. After filtering and/or shaping a data stream of single bit values, the stored data stream may include fewer single bit values for the period of time of the data stream, compared with the data stream prior to being filtered and/or shaped. Thus, a filtered data stream may include a slower data rate and may be and still be considered an accurate digital representation of the input signal sampled by the delta-sigma modulator 220 at the input terminal 224.

Figure 3A:
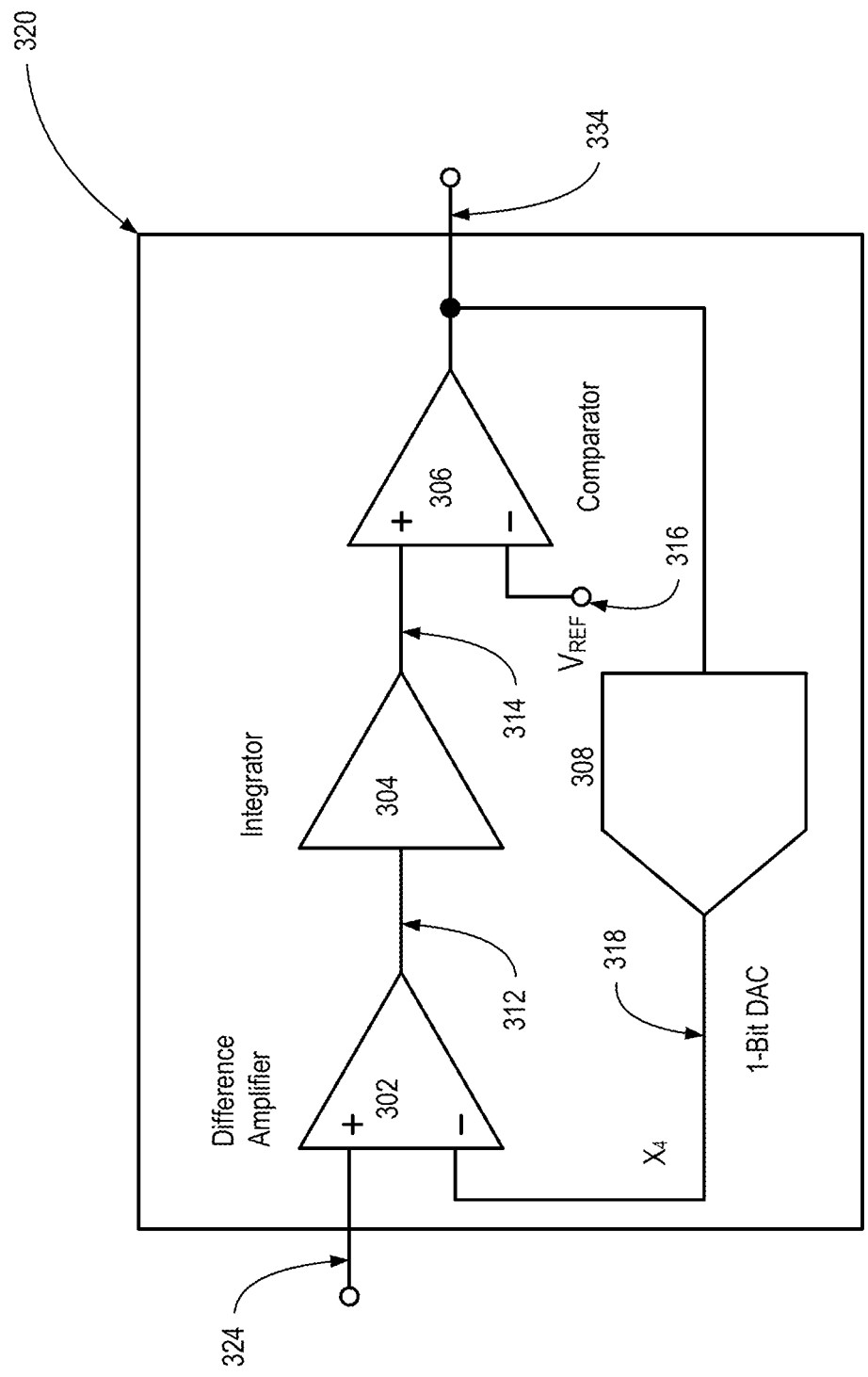
FIG. 3A illustrates a schematic of a delta-sigma modulator of a delta-sigma analog to digital converter, according to one embodiment.

FIGS. 3A and 3B are a schematic of a delta-sigma modulator 320, a voltage input 340, and a corresponding digital output 360, according to one embodiment. The delta-sigma modulator 320 may sample a voltage and output a series of single bit values 360 according to an input signal 340 sampled by the delta-sigma modulator 320. A delta-sigma modulator 320 may include a difference amplifier 302, an integrator 304, a comparator 306, and a one bit digital to analog (D/A) converter 308.

The difference amplifier 302 may include two source voltages (a low voltage source and a high voltage source), and may be configured to amplify the difference between a positive input terminal 324 and a negative input terminal 318 of the difference amplifier 302. The positive input terminal 324 may be electrically coupled with an input signal. The negative input terminal 318 may be coupled with the output of a one bit D/A converter 308, as described herein. The output 312 of the difference amplifier 302 may be the amplified difference of the two inputs 324, 318 of the amplifier 302.

The difference amplifier 302 may be configured to amplify any difference of the inputs 324, 318 until the voltage of the output 312 is approximately equal to a source voltage of the difference amplifier 302. When the input voltage value of the positive input terminal 324 of the difference amplifier 302 exceeds the input voltage value of the negative input terminal 318, then the output voltage value 312 of the difference amplifier 302 may be approximately equal to the voltage of the positive voltage source of the difference amplifier 302.

For example, the difference amplifier 302 may amplify a difference of the inputs 324, 318 so that the corresponding output 312 may equal the source voltage configured to power the difference amplifier. The difference amplifier 302 may be configured according to any suitable amplifier configuration, including the high and low source voltage values, the configuration of the positive and negative input terminals 324, 318, and the configuration of the output terminal 312.

The integrator 304 may be configured to include an input terminal 312 (the output of the difference amplifier) and an output terminal 314. The input terminal of the integrator may be coupled with the output terminal 312 of the difference amplifier 302, so that the voltage values of the difference amplifier output and the integrator input may be identical, or may be sufficiently similar to be considered identical. The integrator 304 may include an output voltage value of the output 314, based on an integral of the voltage value of the input terminal 312 of the integrator 304. The voltage value of the output 314 may increase with a linear slope for a constant positive voltage value of the input terminal 312. Similarly, the voltage value of the output 314 may decrease with a constant linear slope for a constant negative voltage value of the input terminal 312. The output value may alternate between upward and downward slopes based upon a changing voltage value of the input terminal of the integrator 312. The integrator 304 may be configured according to any suitable configuration. The output 314 of the integrator 304 may be coupled with a positive input terminal of the comparator 306.

The comparator 306 may include a positive input terminal 314, a negative input terminal 316, and an output terminal 334. The positive input terminal 314 may be electrically coupled with the output of the integrator 304. The negative input terminal 316 of the comparator 306 may be electrically coupled with a reference voltage so that the reference voltage value and the voltage value at the negative input terminal 316 may be considered substantially identical. The comparator may be configured to output a voltage value at the output terminal 334 based on the difference of the voltage values at the positive and negative input terminals 314, 316.

For example, when the voltage value of the positive input terminal 314 is equal to or exceeds the voltage value of the negative input terminal 316, the voltage value of the output terminal 334 may be equal to a positive source voltage value of the comparator 306. The output terminal 334 of the comparator 306 may be coupled with an input terminal of a one bit D/A converter 308, and may be coupled with one or more filters of the delta-sigma A/D converter. The comparator may be configured according to any suitable configuration.

The one bit D/A converter 308 may include an input terminal 334 electrically coupled with the output terminal 334 of the comparator 306, and may further include an output terminal 318 electrically coupled with the negative input terminal of the difference amplifier 302. The one bit D/A converter 308 may be configured to receive a clock signal, such that following a determined condition of the clock signal, the D/A converter 308 may store an input voltage value, and may output a voltage value at the output terminal 318 based on the stored input value. The output voltage value may be based upon the most recently stored input voltage value. In other embodiments, the one bit D/A converter 308 may be configured to output a voltage value based on the current input voltage value of the input terminal 334, without storing an input voltage value or receiving a clock signal.

The data stream of single bit values 360 at the output terminal 334 of the delta-sigma modulator 320 may be based upon the amplitude of the sampled input signal 340. A data stream 360 of single bit values may be output at the output terminal 334. The output data stream 360 may be configured to include several single bit values, with each single bit value corresponding to a determined interval of time. The delta-sigma modulator 320 may be configured to include a data stream 360, with each single bit value of the data stream representing a sample or an equal amount of time. The over-sampling A/D converter may be configured so that the quantity of positive single bit values present in a determined portion of the data stream 360 may correspond to the positive amplitude of a portion of a sampled input signal 340. Further, the negative amplitude of a portion of a sampled input signal 340 may also be represented by the quantity of empty single bit values in a data stream 360. Thus, a delta-sigma modulator may accurately represent the amplitude of a sampled input signal 340 with a corresponding digital data stream containing several one bit values. For example, the amplitude of a sampled input signal 340 may vary as a sine wave with respect to time. As the peaks of the input signal 340 are sampled, an increasing number of one bit values of the output data stream 360 may be positive single bit values. The digital data stream may alternate between high and low concentrations of positive single bit values according to the amplitude of the sampled input signal.

The delta-sigma modulator 320 may sample an input signal 340 at a rate that is two or more times greater than the frequency of the input signal 340. For example, the delta-sigma modulator 320 may sample the input signal 340 at a rate that is 10 or more times faster than the frequency of the input signal 340. In other embodiments, the delta-sigma modulator 320 may sample the input signal 340 at a rate that is four or more times faster than the frequency of the input signal 340. Accordingly, there may be a large number of single bit values present in a digital data stream corresponding to a portion of a sampled input signal.

Figure 4A:
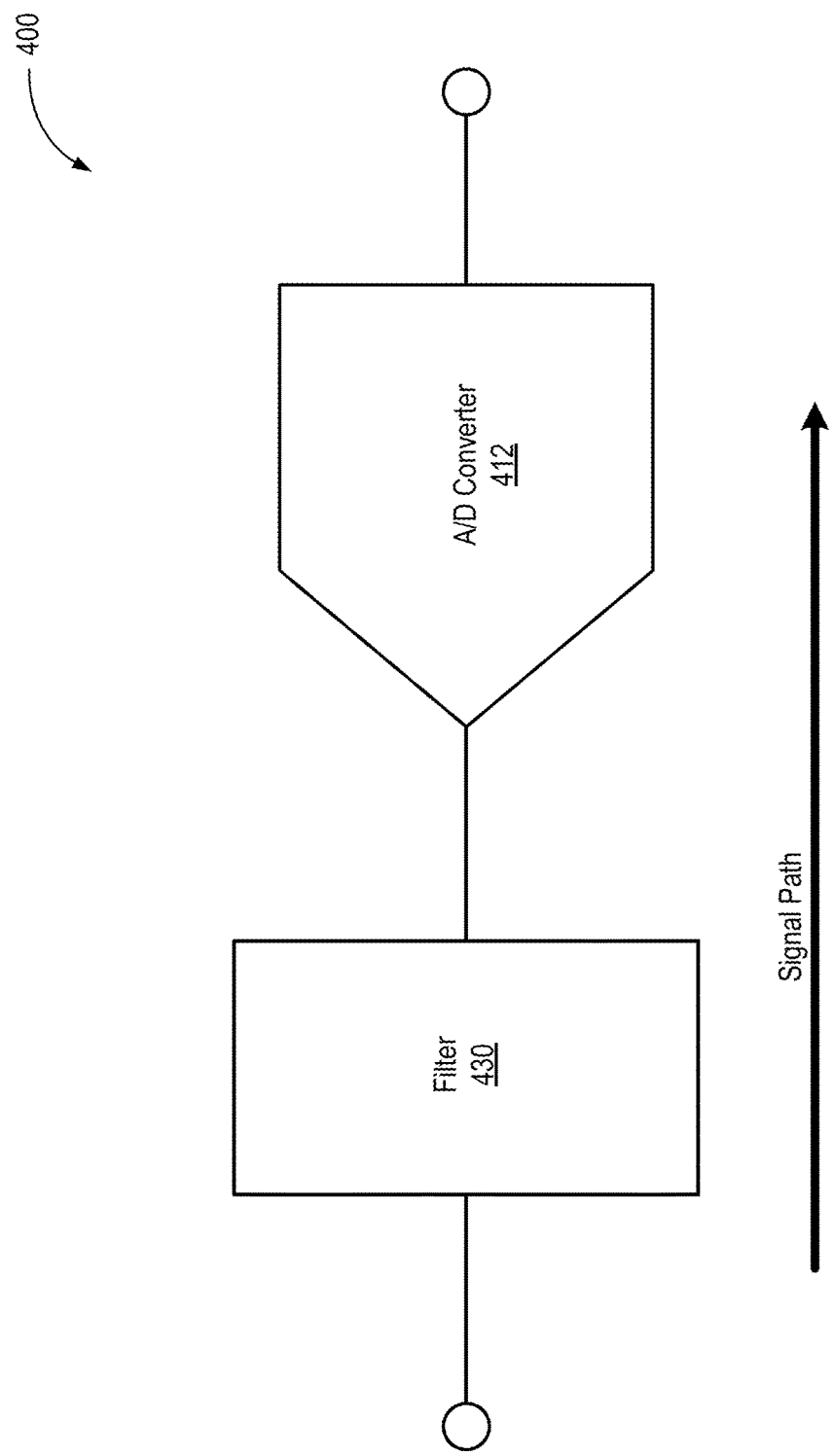
FIG. 4A illustrates a filter electrically connected in series with an input of an analog to digital converter, according to one embodiment.

FIG. 4A illustrates a filter 430 electrically connected in series with an input of an over-sampling A/D converter 412, according to one embodiment. The filter 430 in series with the input of the over-sampling A/D converter 412 may be an analog filter 430. The filter 430 may function as an anti-aliasing filter on the input of the A/D converter, and may introduce one or more limiting characteristics of one or more output values of the A/D converter 412.

Figure 4B:
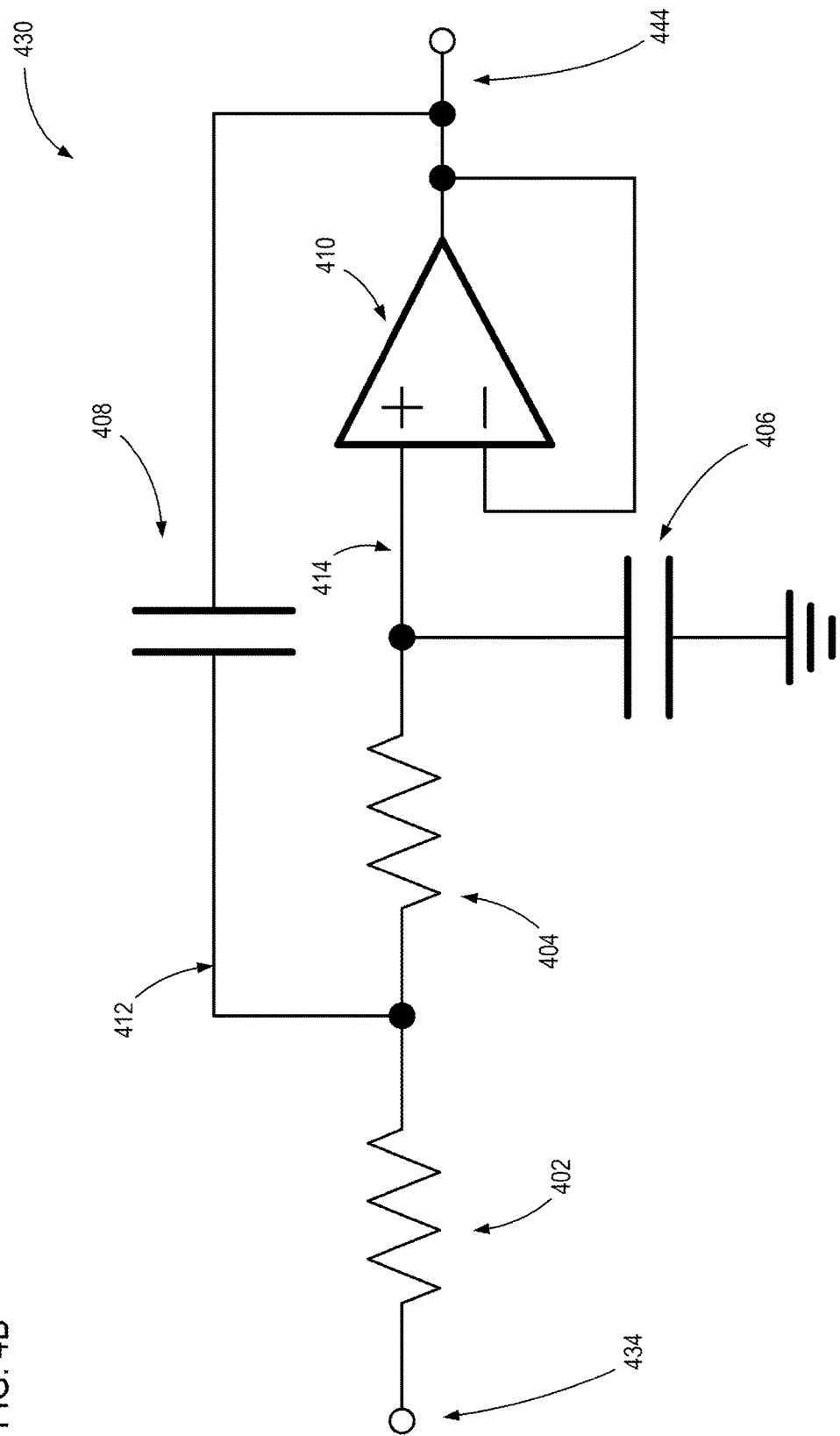
FIG. 4B illustrates an analog filter of the analog to digital converter.

FIG. 4B is a filter 430 associated with a delta-sigma A/D converter, according to one embodiment. As illustrated, a filter similar to the filer 430 may be disposed at the input of an over sampling A/D converter. The filter 430 may include a first resistor 402, a second resistor 404, a first capacitor 406, a second capacitor 408, and an operational amplifier 410.

Figure 4C:
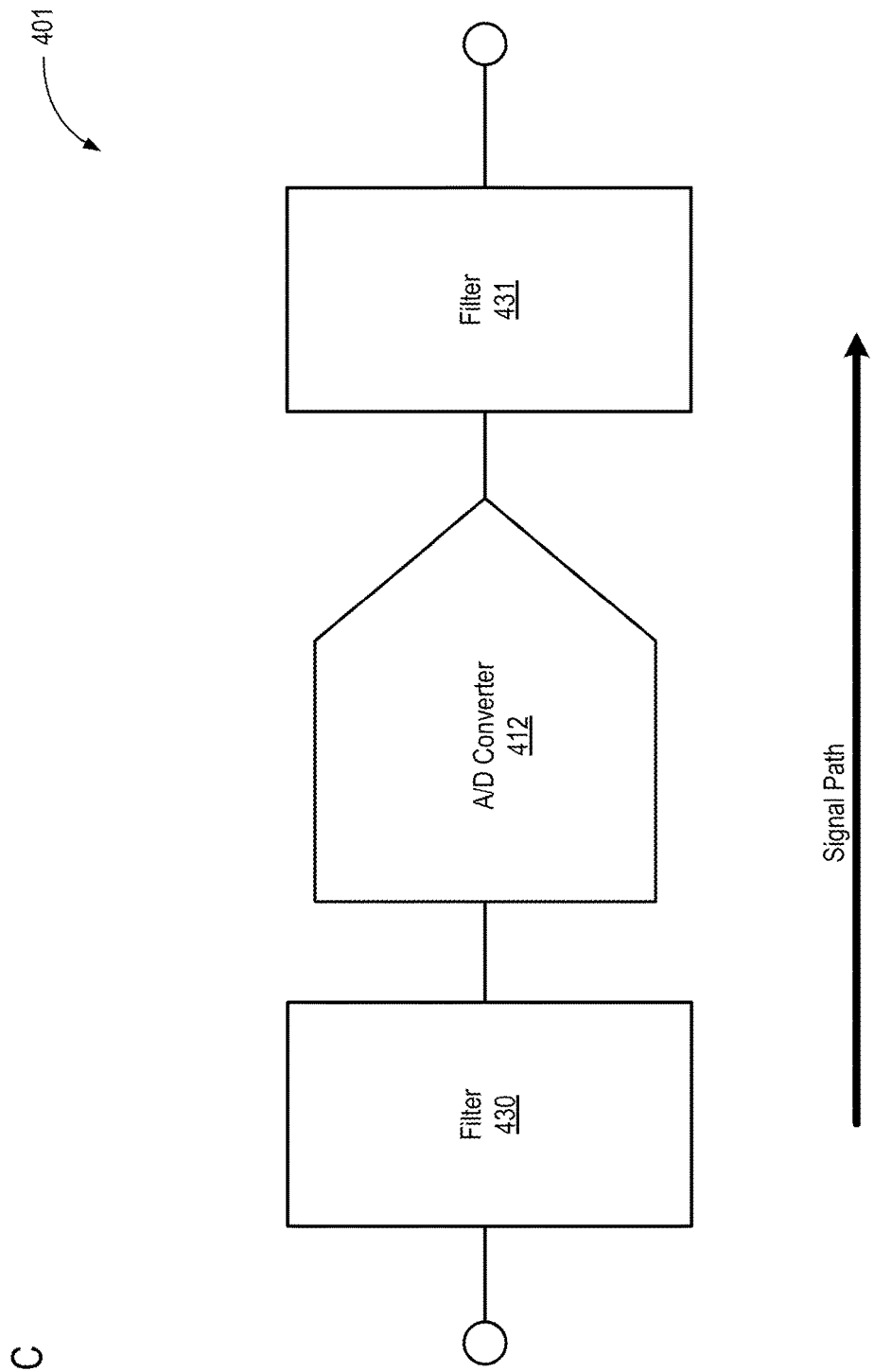
FIG. 4C illustrates the filter of FIG. 4B electrically connected in series with the input of the analog to digital converter of FIG. 4A and another filter electrically connected in series with an output of the analog to digital converter.

FIG. 4C illustrates the filter 430 of FIG. 4B electrically connected in series with the input of the A/D converter 412 of FIG. 4A and another filter 431 electrically connected in series with an output of the A/D converter 412, according to one embodiment.

The first resistor 402 may include a first terminal 434 electrically coupled with an input port of the filter 430. The first terminal 434 of the resistor 402 may be electrically coupled with the input of a delta-sigma modulator. A second terminal 412 of the first resistor 402 may be electrically coupled with the second capacitor 408 and the second resistor 404. The first terminal 412 of the second resistor 404 may be electrically coupled with the first resistor 402 and the second capacitor 408. The second terminal 414 of the second resistor 404 may be electrically coupled with the first capacitor 406 and the positive input terminal of the operational amplifier 410. The first and second resistors 402, 404 may be understood to be passive electrical components, and may be resistive elements of a circuit as typically understood in the art. The resistance values associated with each of the first and second resistors 402, 403 may be determined according to a configuration of the filter 430.

A first terminal 414 of the first capacitor 406 may be electrically coupled with the second resistor 404 and the positive input terminal of the operational amplifier 410. A second terminal of the first capacitor 406 may be electrically coupled to the ground voltage value of the filter 430. The ground voltage value of the filter 430 may be any suitable DC voltage, according to the configuration of the filter 430 and the configuration of the A/D converter 412. A first terminal of the second capacitor 408 may be electrically coupled with the first and second resistors 402, 404. A second terminal of the second capacitor 408 may be electrically coupled with the output terminal 444 of the operational amplifier 410. The first and second capacitors 406, 408 may be passive circuit elements as commonly understood by one proficient in the art. The passive circuit elements of the circuit, and/or the filter 430, may be configured according to any suitable filter and/or circuit configuration.

For example, an impedance value associated with one or more of the circuit elements may be determined according to a particular step response associated with the filter 430. One or more passive circuit elements (resistor, capacitor, inductor) may be replaced with one or more active circuit elements, such as an operational amplifier or transistor. In still other embodiments, the circuit associated with filter 430 may be replaced by one or more digital functions configured to perform operations on a digital data stream, the result of the operations possibly being similar or even identical to the operation of the circuit associated with the filter 430.

The operational amplifier 410 may include a positive input terminal 414 electrically coupled with the second resistor 404 and the first capacitor 406. The operational amplifier 410 may also include a negative input terminal configured to be electrically coupled with an output terminal 444, to cause the voltage value present at the negative input terminal to be identical to the voltage value present at the output terminal 444. The resistors 402, 404, the capacitors 406, 408, and the operational amplifier 410 may be configured to form a filter 430 associated with an A/D converter 412. The various components 402-410 may individually or collectively be arranged according to any suitable arrangement, which may be based on a specific configuration of the filter 430. A suitable configuration of the filter 430 may include a combination of one or more of the suitable filter qualities and/or configurations described in the following paragraphs.

One or more filters associated with a delta-sigma A/D converter may be configured to remove quantization errors present in the digital data stream output by a delta-sigma modulator. The filter may further be configured to remove other kinds of noise from the digital data stream output by the delta-sigma modulator, or to function as an anti-aliasing filter on the input of the A/D converter. The delta-sigma modulator may incorporate quantization error, quantization noise, and other common kinds of noise into the output digital data stream. The noise and/or errors present in the digital data stream output by the delta-sigma modulator may exist at frequencies centered around the sampling frequency of the delta-sigma modulator. However, the frequency of the information of interest present in the digital data stream may be centered at a smaller frequency than the sampling frequency of the delta-sigma modulator. More than one filter may be associated with the delta-sigma A/D converter to facilitate removal and/or attenuation of one or more noise elements without removing or attenuating a portion of the digital data stream containing some or all of the information of interest.

An over-sampling A/D converter may include noise elements centered on frequencies other than the sampling frequency of the delta-sigma modulator. The quantity of filters associated with the delta-sigma A/D converter, and the configuration of the filters, may be based on the frequency distribution and amplitude of the various noise elements present in a digital data stream output by the delta-sigma modulator. For example, noise elements with an amplitude that is large, relative to an amplitude of the information of interest of the delta-sigma modulator output may be included. To attenuate and/or remove these and possibly other noise elements, the delta-sigma A/D converter may include more than one filter, possibly with the output of each filter coupled with the input of another filter, to create an effective filter capable of greater attenuation and/or removal of one or more noise elements. Though certain embodiments may include more than one filter, with each filter associated with a specific and possibly distinct filter step response, the collection of one or more filters may be referred to herein as a single filter, and may be associated with an effective filter step response.

The filter may reduce the number of one bit values present in a digital data stream output by the delta-sigma modulator. As the filter removes and/or attenuates specific frequency components of the digital data stream, the number of one bit values representing the amplitude of the sampled input signal for each determined time interval may be reduced. The filter associated with the delta-sigma A/D converter may be implemented as either digital functions or analog circuitry. The filter may be an analog low pass filter according to a Sallen-Key filter topology. However, the filter associated with the delta-sigma A/D converter may be any suitable filter, and may be configured according to any suitable filter configuration.

The filter(s) associated with the delta-sigma A/D converter may have any suitable step or impulse response. Many different types of filter topologies may be associated with the delta-sigma A/D converter. For example, the filter may be a sinc filter, a high pass filter, a low pass filter, a sinc in time filter, a sinc in frequency filter, a band pass filter, a notch filter, a comb filter, or any other suitable kind of filter. The different noise filtering, digital data stream shaping, and/or other suitable features of a specific filter included in the filter may influence the step response of the filter associated with the delta-sigma A/D converter. For example, the features of a filter may facilitate detection of one or more failures of an over-sampling A/D converter.

Figure 5:
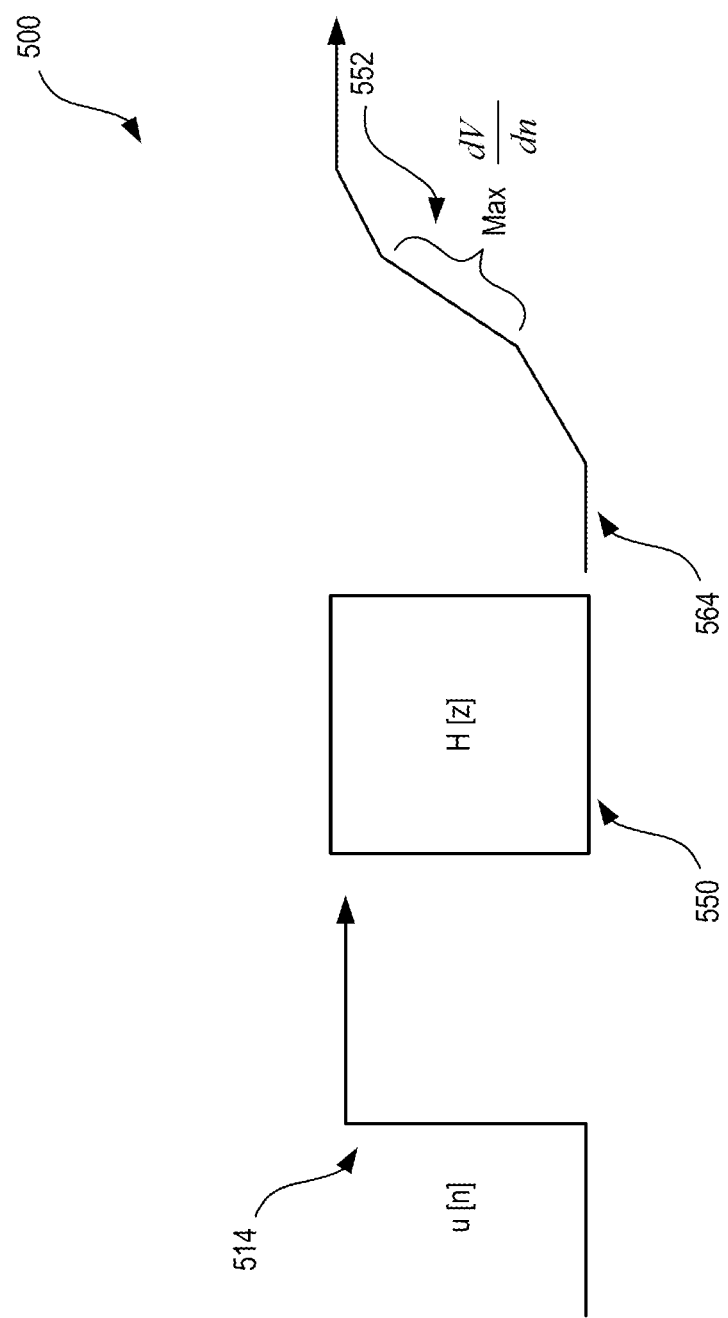
FIG. 5 illustrates a diagram of one embodiment of a Heaviside step function as an input to a filter transfer function in the z-domain with a corresponding output or step response of the transfer function.

FIG. 5 is a diagram 500 of a Heaviside step function, or a unit step function 514, as an input to a filter transfer function 550 in the z-domain (denoted H(z)) with a corresponding output or step response 564 of the transfer function 550. A delta-sigma A/D converter may contain cascaded integrator-comb (CIC) filters, sinc-shaped filters, or sinc filters, among other possible analog or digital filters associated with the A/D converter. A limiting characteristic of a CIC filter associated with a delta-sigma A/D converter based on the step response 564 of the CIC filter may be determined. The rise-time of a low-pass filter, such as a CIC filter, may be limited by the nature of its design and the maximum rise time on the output of such a filter may be found in a step response 564. Further, the difference between two consecutive values of the filter output may be limited by the rise time 552 of the step response 564.

Figure 6A:
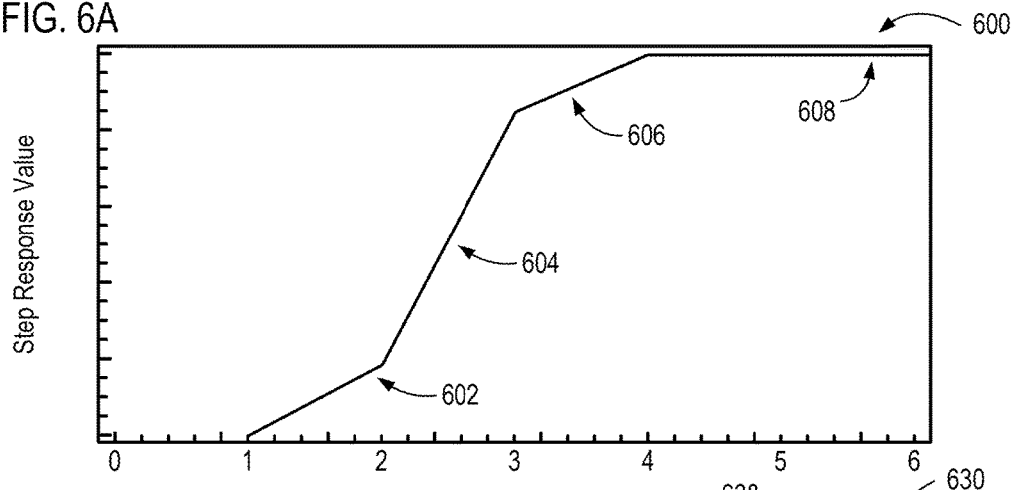
FIG. 6A illustrates a step response of a sinc filter, according to one embodiment.
Figure 6B:
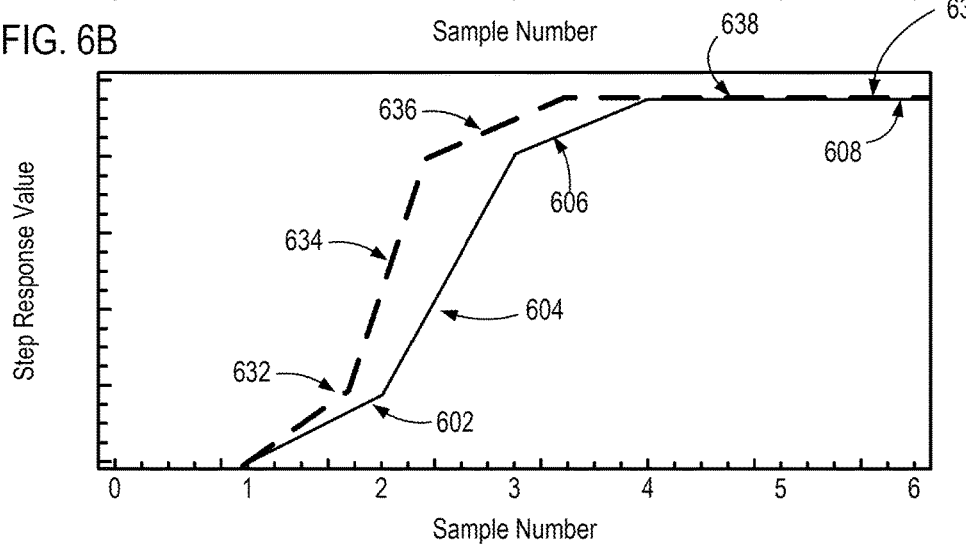
FIG. 6B illustrates the step response of FIG. 6A and an output of the sinc filter, according to one embodiment.
Figure 6C:
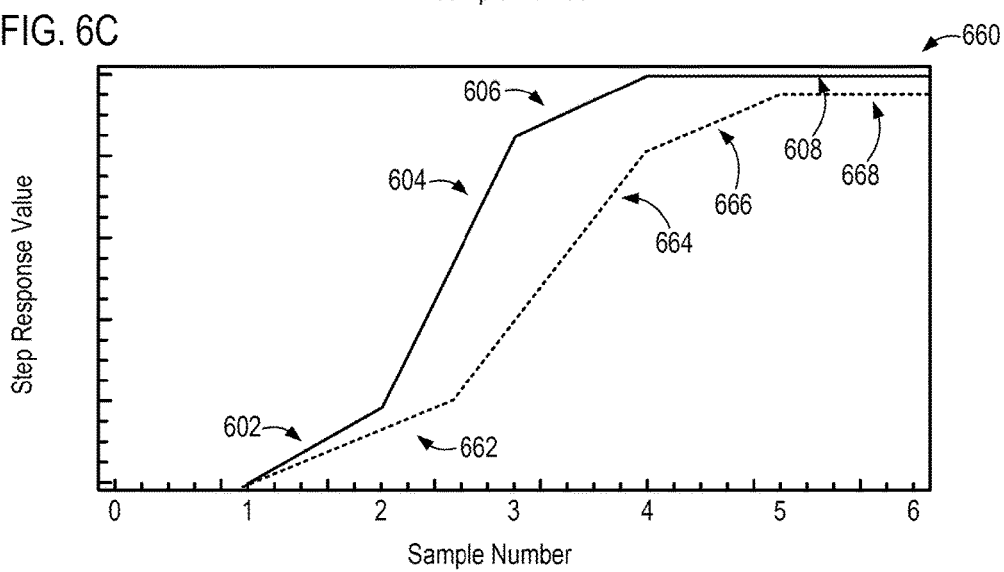
FIG. 6C illustrates the step response of FIG. 6A and an output of the sinc filter, according to one embodiment.

FIGS. 6A-6C are digital representations of a filter response with corresponding output values, according to various embodiments. FIG. 6A is a graph of the amplitude of a step response 600 of a filter with respect to time. The step response 600 may be the step response of a filter associated with an over-sampling A/D converter. The step response may also be represented digitally with amplitude values corresponding to discrete samples. Each sample may be consecutively numbered with respect to all other samples, and each sample may be associated with a specific time value. The step response 600 of the filter associated with the A/D converter may be the output of the filter associated with an ideal step function input of the filter. The step response of the filter may be defined according to time or frequency.

For example, the step response 600 is defined with respect to time, with each sample value along the x-axis associated with a particular time value. The filter step response 600 may include a slope limit value. The slope limit value may be associated with one or more portions of the filter step response 600. Further, the slope limit value may be a unique slope limit value associated with the filter of a specific A/D converter. The slope limit value may be a maximum slope of the output of the filter. In other embodiments, the slope limit value may be a value based on a maximum slope of an output of the filter. In yet other embodiments, the slope limit value may be based on an average slope value of the filter step response 600. However, the slope limit value may be defined according to any suitable characteristic of the filter step response 600, or any suitable characteristic of the filter and/or A/D converter.

The step response of the filter 600 may be configured to include several slope values of the step response of the filter. As described previously, a slope value may be based on a change in the amplitude of the step response 600 between any two samples of the step response 600. For example, the step response 600 of the filter may include four slope values 602, 604, 606, and 608. The first slope value 602 may be the slope of the line defined by the amplitude of the step response 600 at the first sample and the amplitude of the step response 600 at the second sample. The second slope value

604 may be the slope of the line between the amplitude of the step response 600 at the second sample and the amplitude of the step response 600 at the third sample. The second slope value 604 may be larger than the first slope value 602. In other embodiments, the first slope value 602 may be greater than the second slope value 604. In still other embodiments, the first and second slope values 602, 604 may be equal.

A third slope value 606 may be defined as the slope of the line formed by the amplitude of the step response 600 at the third sample and the amplitude of the step response 600 at the fourth sample. The third slope value 606 of the filter step response 600 may be equal to, greater than, or less than the first and/or second slope values 602, 604, according to the configuration of the filter, and the step response 600 associated with the filter. The fourth slope value 608 may be the slope of the line defined by the amplitude of the step response 600 between the fourth and fifth samples of the step response 600. The fourth slope value 608 may be approximately equal to zero. In other embodiments, the fourth slope value may be substantially greater than zero.

The slope values 602, 604, 606, 608 of the filter step response 600 may, in some embodiments, be a slope limit value. A second slope value 604 of the filter step response 600 may be a slope limit value associated with the filter of an A/D converter. The second slope value 604 may be a slope value that is equal to, or greater than, all other slope values 602, 606, 608 associated with the filter step response 600 of an A/D converter. A slope limit value may include a maximum output slope value of a slope of an output of an A/D converter, associated with the filter step response 600.

A slope of an A/D converter output between any two points of the output may be restricted to be less than a slope limit value, or maximum output slope value. For example, a slope of an output of a properly functioning A/D converter filter of the step response 600 may be less than the second slope value 604, for any slope defined between two samples of the output of the filter associated with the step response 600. In other embodiments, the filter output of a properly functioning A/D converter may be restricted by a maximum output slope to be less than any slope limit value of the slope values of the step response 600. For example, an output slope of a properly functioning over-sampling A/D converter may be restricted to be less than the first slope value 602, the third slope value 606, the fourth slope value 608, or any other suitable value, such as an increased and/or scaled value corresponding to a slope limit value.

FIG. 6B is the filter step response 600 of FIG. 6A, and a filter output 630, of the filter of the step response 600, according to one embodiment. Similar to the step response 600, the filter output 630 may include one or more output slope values defined by the amplitude of the filter output 600 between two samples. For example, filter output 630 may include four output slope values 632, 634, 636, 638 defined between samples corresponding to the samples of the slope values 602, 604, 606, 608 of the filter step response 600. An output slope value may be defined by the amplitudes of a filter output 630 between two or more samples of the filter output 630.

Specifically, an output slope value may be a change in amplitude between two samples. An output slope value may include a change in output amplitude between two or more samples scaled by an amount of time associated with the number of samples between the two output amplitudes. For example, an output slope value may be defined as a change in output amplitude between two or more samples, with the change in output amplitude divided by an amount of time corresponding to the two or more samples of the output amplitudes. A first output slope value 632 may be the slope of the line defined by the amplitude of the filter output 630 at a first sample and the amplitude of the filter output 630 at a second sample. A second output slope value 634 may be the slope of the line between the amplitude of the filter output 630 at the second sample and the amplitude of the filter output 630 at a third sample.

The second output slope value 634 may be larger than the first output slope value 632. In other embodiments, the first output slope value 632 may be greater than the second output slope value 634. In still other embodiments, the first and second output slope values 632, 634 may be equal to each other, or may be approximately equal to each other.

A third output slope value 636 may be defined as the slope of the line formed by the amplitude of the filter output 630 at the third sample and the amplitude of the filter output 630 at a fourth sample. The third output slope value 636 of the filter output 630 may be equal to, greater than, or less than the first and/or second output slope values 632, 634, according to the configuration of the filter output 630 and the filter step response 600. A fourth output slope value 638 may be the slope of the line defined by the amplitude of the filter output 630 between the fourth sample and a fifth sample of the filter output 630.

The fourth output slope value 638 may be approximately equal to zero. In other embodiments, the fourth slope value may be substantially greater than zero. In yet other embodiments, the fourth output slope value 638 may hold any suitable relation with any of the other output slope values 632, 634, 636.

The filter output 630 of an A/D converter may include an output slope value exceeding a slope value limit that is configured to be a maximum output slope value. For example, the second output slope value 634 of the filter output 630 may exceed the second slope value 604 of the filter step response 600. The second slope value 604 of the filter step response 600 may be a slope value limit of an A/D converter filter associated with the filter output 630.

FIG. 6C is the filter step response 600 of FIG. 6A, and a filter output 660, of the filter of the step response 600, according to one embodiment. Similar to the step response 600, the filter output 660 may include one or more output slope values defined by the amplitude of the filter output 600 between two or more samples. For example, the filter output 660 may include four output slope values 662, 664, 666, 668 defined between the samples corresponding to the samples of the slope values 602, 604, 606, 608 of the filter step response 600.

An output slope value of the filter output 660 may be defined by the amplitudes of a filter output 660 between two or more samples of the filter output 660. Specifically, an output slope value may include a change in amplitude between two or more output amplitudes associated with two or more samples.

An output slope value may include a change in output amplitude between two or more output amplitudes associated with two or more samples, the change scaled by an amount of time associated with the number of samples between the two or more output amplitudes.

For example, an output slope value may be defined as a change in an output amplitude between two or more samples, with the change in output amplitude divided by an amount of time corresponding to the two or more samples of the output amplitudes. A first output slope value 662 may be the slope of the line defined by the amplitude of the filter output 660 at a first sample and the amplitude of the filter output 660 at a second sample. A second output slope value 664 may be the slope of the line between the amplitude of the filter output 660 at the second sample and the amplitude of the filter output 660 at a third sample.

The second output slope value 664 may be larger than the first output slope value 662. In other embodiments, the first output slope value 662 may be greater than the second output slope value 664. In still other embodiments, the first and second output slope values 662, 664 may be equal to each other, or may be approximately equal to each other. In some embodiments, the second output slope value 664 may exceed a slope limit value 604 of the filter step response 600.

An output of an A/D converter may facilitate identification of a failure of the A/D converter. If an A/D converter output includes an output slope value 634 greater than a slope value limit 604, an IED may be configured to identify a failure of the A/D converter. The IED may be further configured to compare the output slope values of a second A/D converter configured to sample the same input signal, to determine if the second A/D converter output includes similar output slope values exceeding a slope value limit. The IED may be configured to determine the likelihood of a failure of the first A/D converter based upon one or more output slope values of the second A/D converter output.

A third output slope value 666 may be defined as the slope of the line formed by the amplitude of the filter output 660 at the third sample and the amplitude of the filter output 660 at a fourth sample. The third output slope value 666 of the filter output 660 may be equal to, greater than, or less than the first and/or second output slope values 662, 664, according to the configuration of the filter output 660 and the filter step response 600. A fourth output slope value 668 may be the slope of the line defined by the amplitude of the filter output 660 between the fourth sample and a fifth sample of the filter output 660. The fourth output slope value 668 may be approximately equal to zero. In other embodiments, the fourth slope value may be substantially greater than zero. In yet other embodiments, the fourth output slope value 668 may hold any suitable relation with any of the other output slope values 662, 664, 666.

Each of the slope values and each of the output slope values of a filter step response and a filter output may include any suitable slope value or output slope value. A slope value or output slope value may be defined by a slope of a line formed by the amplitude of the step response 600 or filter outputs 630, 660 at two or more samples. For example, one or more of the slope values and/or slope output values may be defined as the slope of the line formed by an amplitude at a first sample and a fourth sample. In other embodiments, the first slope value may be defined by amplitudes at a second sample and a fifth sample. However, each of the slope values and/or output slope values may be defined by any suitable amplitude at any suitable sample associated with the filter step response 600 and/or outputs 630, 660 of a filter associated with an A/D converter.

The step response 600 and/or filter outputs 630, 660 may include a greater number of slope values and/or output slope values. For example, the step response 600 and/or filter outputs 630, 660 may be configured to include 1,000 slope values between the first sample and a final sample. In other embodiments, the step response 600 and/or the filter outputs 630, 660 may be configured to include fewer slope values and/or output slope values, such as two or fewer. However, the filter step response 600 and/or the filter outputs 630, 660 may reflect any suitable filter configuration and any suitable number of slope values and/or filter samples.

A comparator may be configured to compare one or more output slope values of an A/D converter output with a determined A/D converter slope value limit. The IED may report a failure of an A/D converter based on the comparison of the output slope value and the slope value limit of the A/D converter. The IED may report a failure of an A/D converter if an output slope value of the over-sampling A/D converter exceeds a determined slope value limit. For example, the output slope value 634 may exceed a slope limit value 604. The comparator may be configured to compare output slope value 634 and the slope limit value 604. The comparator may be configured to determine that the output slope value 634 is greater than the slope limit value 604.

The IED may be configured to report a failure of an A/D converter via any suitable reporting method. For example, the IED may be configured to report the failure of the A/D converter to a communication system coupled with the IED. The IED may be configured to illuminate one or more warning lights, and may indicate the failure with the one or more illuminated warning lights. The IED may be configured to respond to one or more identified failures of an A/D converter by altering one or more processes and/or by configuring one or more components of a power system coupled with the IED. However, the IED may be configured to operate according to any suitable manner in response to one or more identified failures of an A/D converter.

Figure 7A:
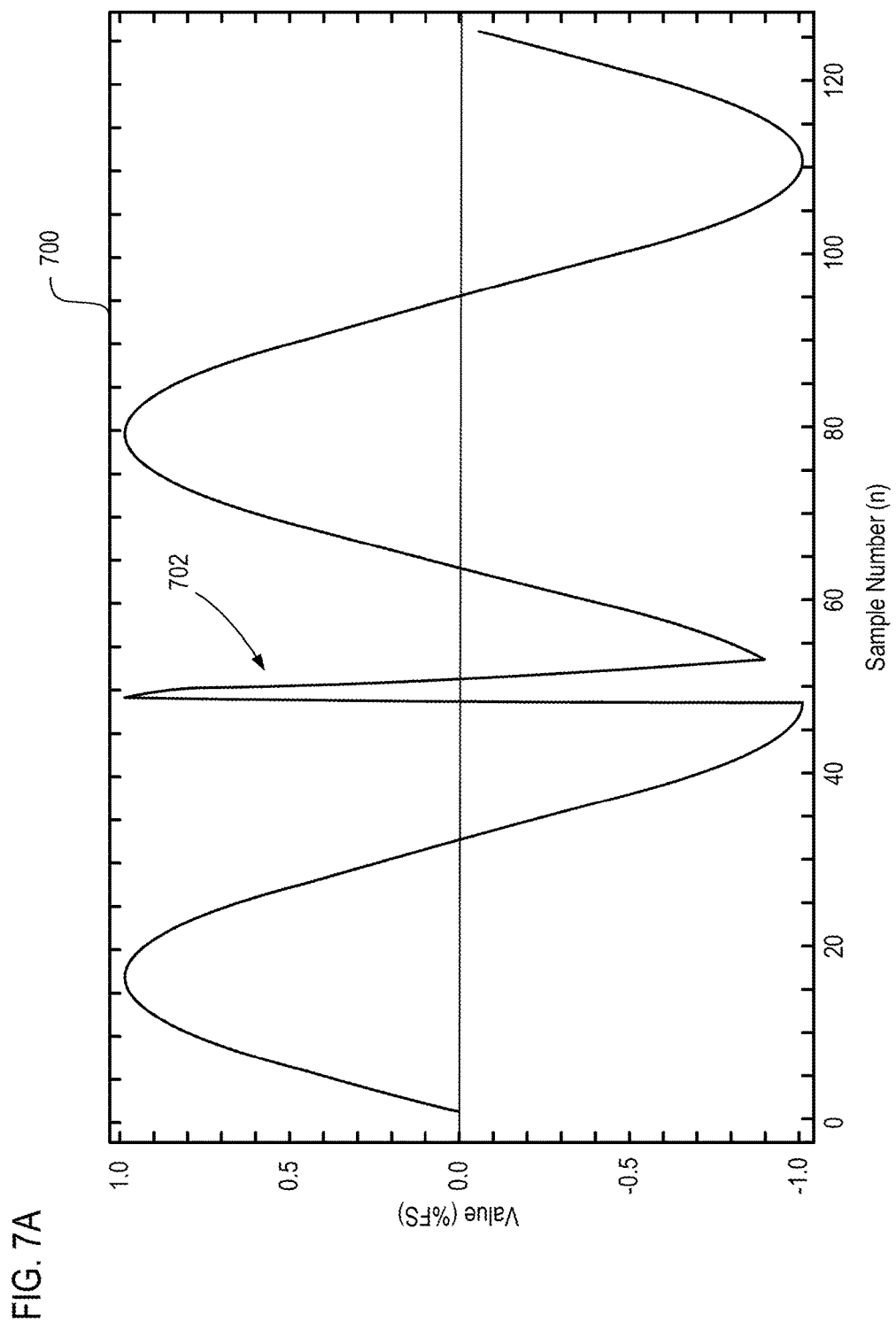
FIG. 7A illustrates a digitized sine wave and value anomaly output of an analog to digital converter according to one embodiment.

FIG. 7A shows a sine wave that is being digitized or input to an A/D converter and one or more analog and/or digital filters associated with the A/D converter. By knowing one or more limiting characteristics of a filter associated with the A/D converter, a glitch 702, or an input value anomaly, may be detected. For example, the glitch may be detected as a glitch or input value anomaly when the values associated with the input value anomaly exceed one or more determined limits of a filter associated with the A/D converter. Thus, if the glitch is detected that exceeds one or more limits of an A/D converter filter, an error or failure may be reported, and one or more trip functions may be blocked.

Figure 7B:
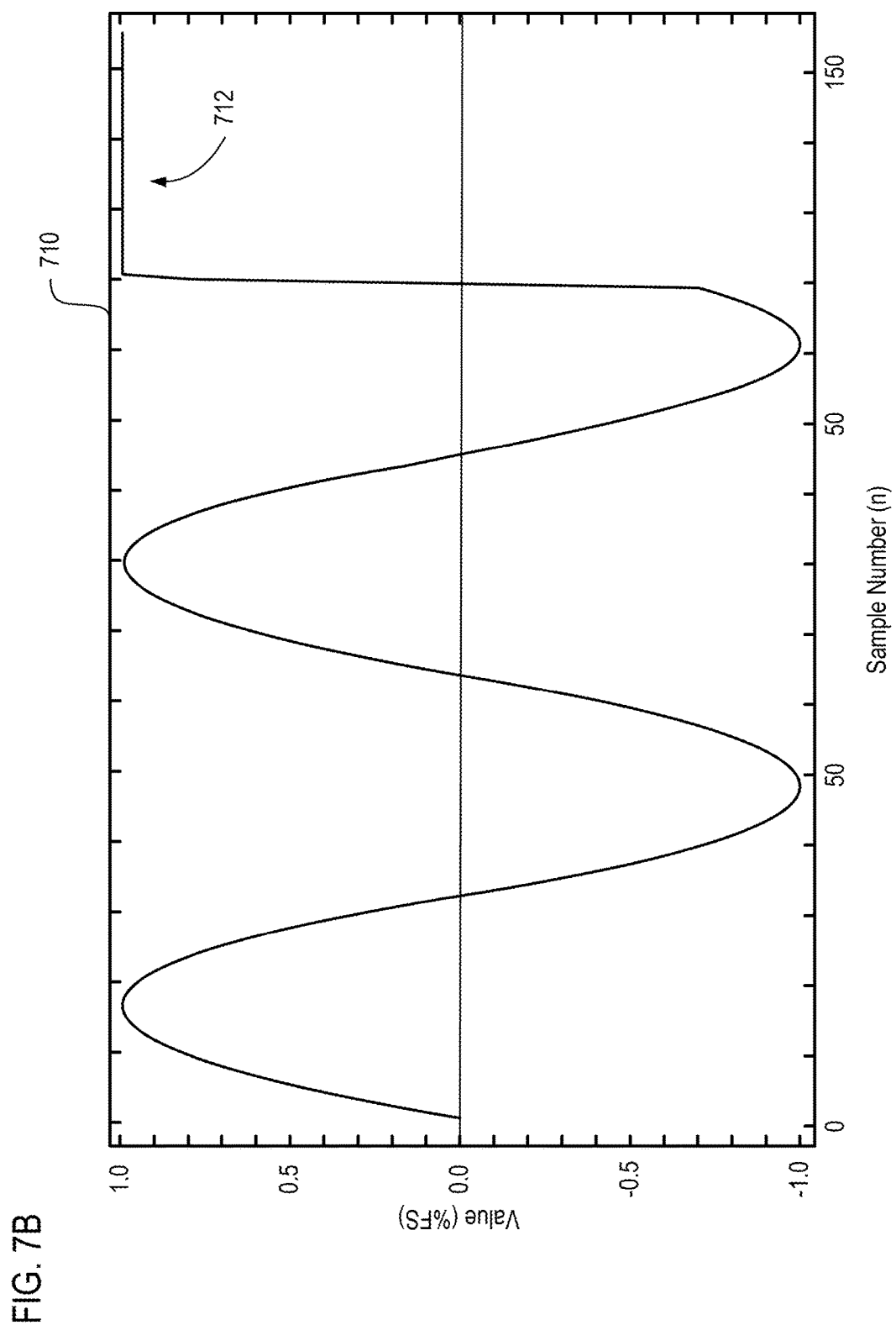
FIG. 7B illustrates a sine wave output and approximately constant full-scale output values of an analog to digital converter, according to one embodiment.

FIG. 7B is a graph 710, showing a sine wave that is being digitized by, or input to, an A/D converter. An output of the A/D converter "rails" 712 or produces a plurality of saturated values 712, and produces a constant output code indicating a constant full-scale output value. At approximately the same time as the moment the output of the A/D rails, the maximum dV/dt of the A/D converter is exceeded. Thus, a failure or error may be reported to indicate that the constant or approximately constant full-scale output values are false or inaccurate. The system may detect such a failure to allow a protective relay to safely disable protection (e.g. prevent or block a breaker trip function).

Figure 7C:
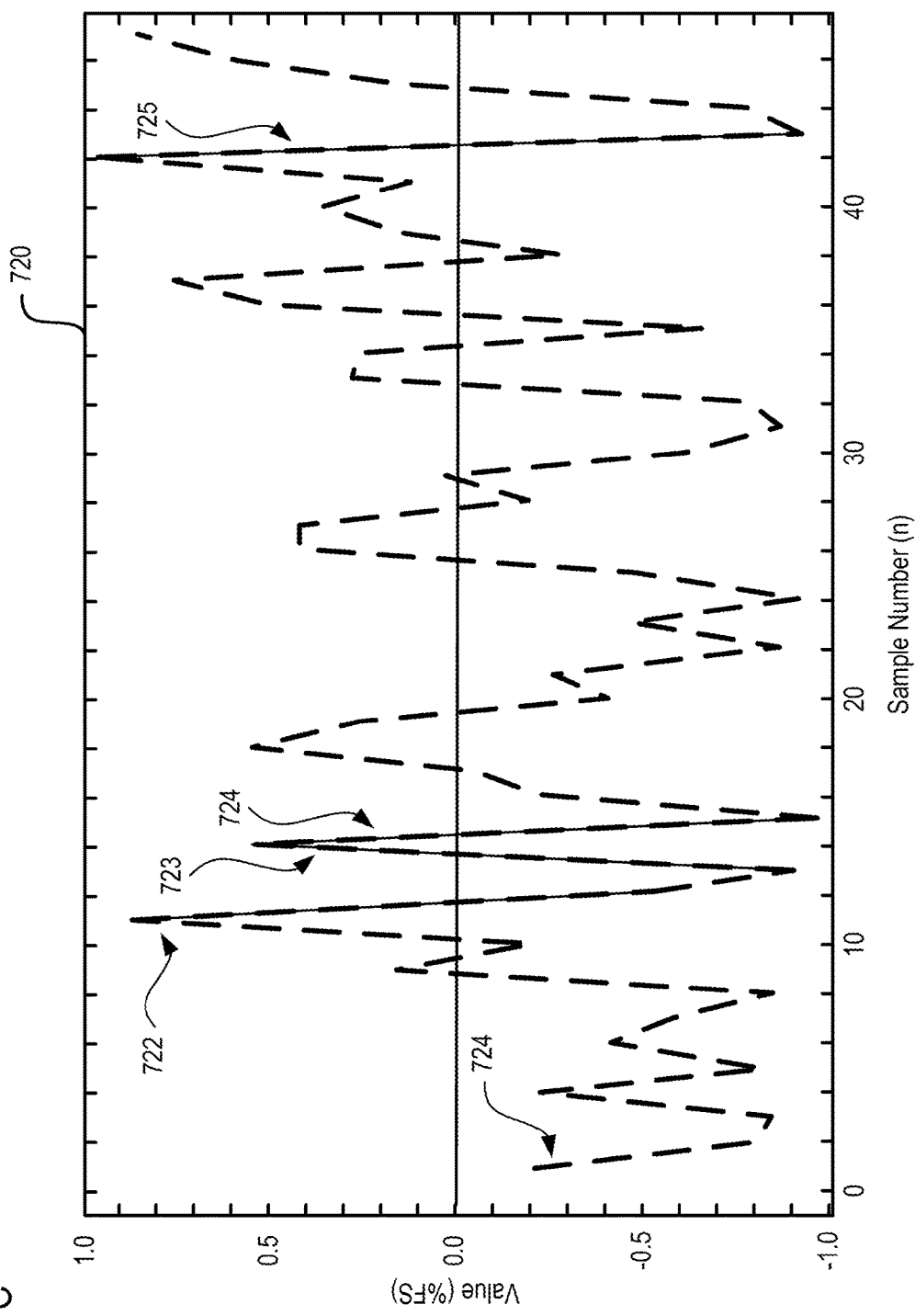
FIG. 7C illustrates several measured values of an output of a delta-sigma analog to digital converter associated with one or more failures, according to one embodiment.

FIG. 7C is a graph 720 of several measured values 724 of an output of a delta-sigma A/D converter with a $3^{rd}$ order CIC filter and oversample ratio ("OSR") of 64 is shown in FIG. 7C. The delta-sigma A/D converter of FIG. 7C may include one or more failures in response to a sufficiently large input voltage. By comparing the measured values 724 with the maximum derivative limit derived, the data is known to be incorrect due to multiple excursions 722, 723, 724, 725 beyond the derivative limitation. Thus, a protective relay may recognize when one or more output values of an output of an A/D converter is invalid, false, and/or includes one or more errors, or that one or more failures are associated with the A/D converter, and may take appropriate action.

Figure 8C:
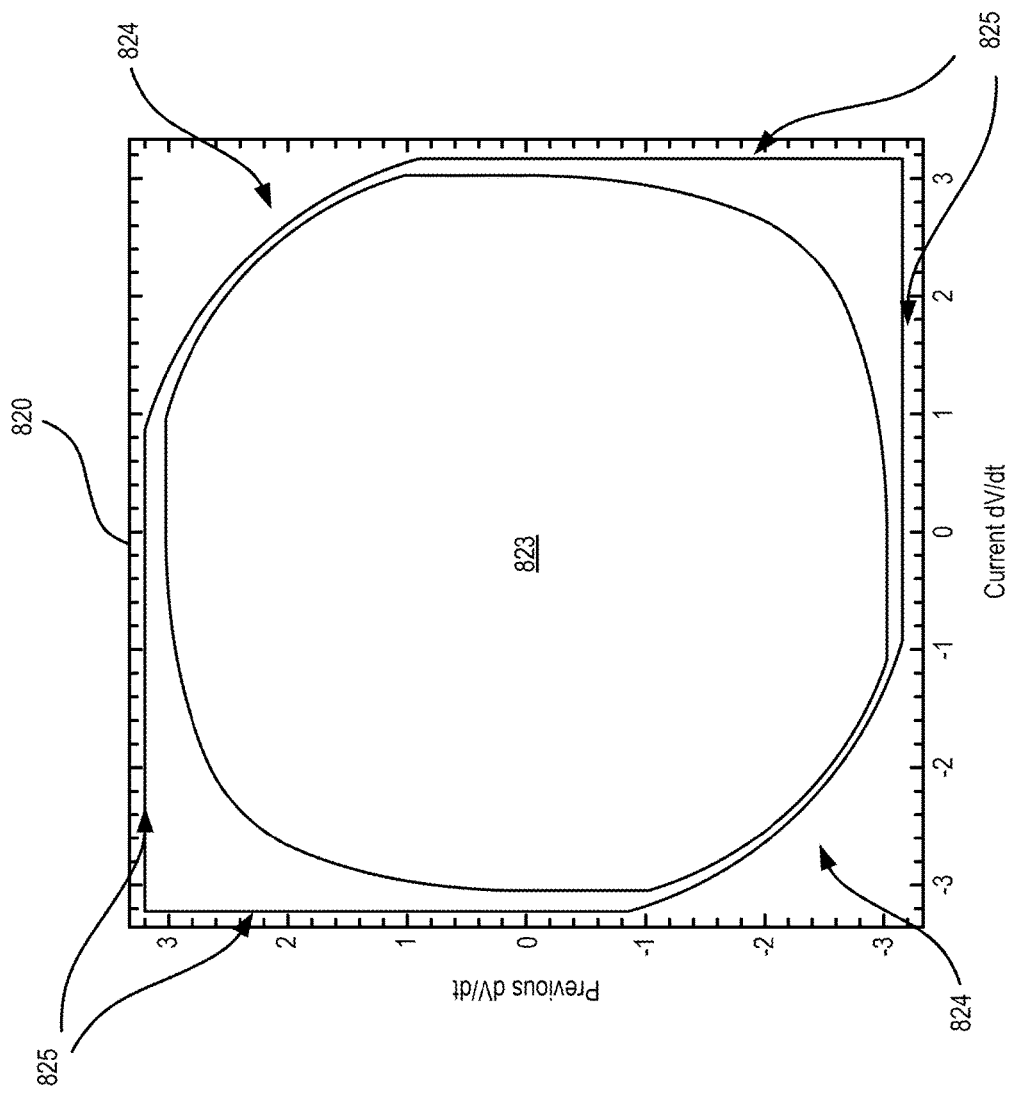
FIG. 8C illustrates a graph of several values of derivatives of an output of an analog to digital converter that are compared with a plurality of determined limits associated with an output of the analog to digital converter, according to the embodiments of FIG. 8A and FIG. 8B.

FIG. 8A illustrates a table 800 of a plurality of maximum values shown in percent full-scale (% FS), according to one embodiment of the present disclosure. FIG. 8B illustrates a table 810 of several time values (n), step response values (h[n]), derivative values, etc. FIG. 8C illustrates a graph 820 of several values of an output of an A/D converter compared with a plurality of determined limits associated with the A/D converter.

More specifically, FIG. 8B is a table 810 of several time values (n), step response values (h[n]), derivative $$\left. \frac{dV}{dt} \right|_{t=n}$$

values, and values of an output of an A/D converter associated with a $3^{rd}$ order CIC filter and an OSR of 64, according to the embodiment of FIG. 8A. FIG. 8C is a graph 820 of several values of an output of an A/D converter compared with a plurality of determined limits, according to the embodiment of FIG. 8B.

A delta-sigma A/D converter may contain one or more CIC filters, sinc-shaped filters, sinc filters, or other possible analog or digital filters. A system may determine a limiting characteristic of a filter associated with a A/D converter based on the step response of the filter. The rise-time of a low-pass filter, such as a CIC filter, may be limited by the nature of its design and the maximum rise time on the output of such a filter may occur in response to a step response.

For an $M^{th}$ order CIC filter, the transfer function may be calculated according to equation 1:

$$H(z) = \left[ \frac{1-z^{-N}}{1-z^{-1}} \right]^M \quad \text{Equation 1}$$

In Equation 1, N corresponds to the oversample-ratio (OSR) and M corresponds to the order of the CIC filter. The step response of an $M^{th}$ order CIC filter may be calculated according to equation 2 below:

$$H[n, a] = \frac{1}{N^M} \sum_{j=0}^{n} \binom{M}{j-a}_{N-1} \quad \text{Equation 2}$$

In Equation 2, a corresponds to a shift in the step response of the CIC filter with respect to n=0, and $\binom{M}{j-a}_{N-1}$ corresponds to one or more multinomial coefficients. In one embodiment, the maximum difference between two consecutive values of the output of a CIC filter associated with a delta-sigma A/D converter may be calculated according to equation 3 below:

$$\max_{n \in N}(\Delta H[n]) = \frac{1}{N^M} \sum_{j=\lceil \frac{M(N-1)}{2} - \frac{N}{2} \rceil}^{\lfloor \frac{M(N-1)}{2} + \frac{N}{2} \rfloor} \binom{M}{j-a}_{N-1} \quad \text{Equation 3}$$

Several common values of N and M may be determined from Equation 3, yielding one or more maximum values of one embodiment, shown in percent full-scale (%FS) in the table 800 of FIG. 8A.

For example, in one embodiment the system may include a 3rd order CIC filter with an over-sample ratio (OSR) of 32, and a determined maximum difference between any two consecutive values of an output associated with the digital filter of 66.7% FS or less. Further, the system may monitor several output values of the A/D converter associated with a $3^{rd}$ order CIC filter, and may compare a difference of any two consecutive values of the output with the determined maximum difference between any two consecutive values of the output. If a difference of two consecutive values of the output exceeds the determined maximum difference value, an A/D failure may be determined and/or reported, and any appropriate action may be taken (e.g. blocking a trip function or preventing a breaker trip signal).

Other embodiments may include modules that monitor and/or analyze several values of an output of an A/D converter based on other behaviors or analysis of a filter associated with the A/D converter. Thus, the system may analyze the values of the output according to other mathematical manipulations. More specifically, some consecutive values of the output may not cause a reported failure but may cause a reported failure according to other conditions, criteria, and/or analysis. As an example of such analysis, some embodiments may include a limit on mathematical combinations of 3 consecutive values all moving in the same direction. Such a limit may be determined according to Equation 4, referred to herein as a vector magnitude test.

$$\sqrt{\left(\frac{dV}{dt}\bigg|_{t=n}\right)^2 + \left(\frac{dV}{dt}\bigg|_{t=n-1}\right)^2} \leq \text{LIMIT} \quad \text{Equation 4}$$

For example, the table 810 of FIG. 8B includes several time values (n), step response values (h[n]), derivative $$\left. \frac{dV}{dt} \right|_{t=n}$$

values, and values according to Equation 4 of one embodiment of an A/D converter associated with a $3^{rd}$ order CIC filter and an OSR of 64. As may be observed in the data of table 810, one embodiment of the vector magnitude test has a limit of 69.04% FS. In some embodiments, the system may be configured to continuously monitor sets of 3 consecutive values of an output of an A/D converter, and may compare a value determined according to equation 4 with a determined limit (e.g. 69.04% FS). If the value determined according to equation 4 exceeds the determined limit, the IED may record the incident and/or report a failure associated with the A/D converter, and may cause or enable any appropriate action (e.g. blocking a trip function).

FIG. 8C is a graph 820 of several values of an output of an A/D converter compared with a plurality of determined limits. The horizontal axis showing an actual derivative dV/dt or a difference of a most recent value of an output of an A/D converter and a value preceding the most recent value of the output. The vertical axis represents a previous derivative, or a difference of two consecutive values of the output of the A/D converter preceding the most recent value of the output of the A/D converter. The output values 823 were measured according to the delta-sigma A/D converter with a 3rd order CIC filter configured with an over-sample ratio of 64. The maximum difference limit 825 limits any digital derivatives of the output of the A/D converter, regardless of the previous digital derivatives. The vector magnitude test 824 limits digital derivatives of the same sign. The system may to monitor values of an output of an A/D converter and may verify that combinations of derivatives or other mathematical combinations of the values do not exceed any pre-determined limits associated with the A/D converter.

Figure 9:
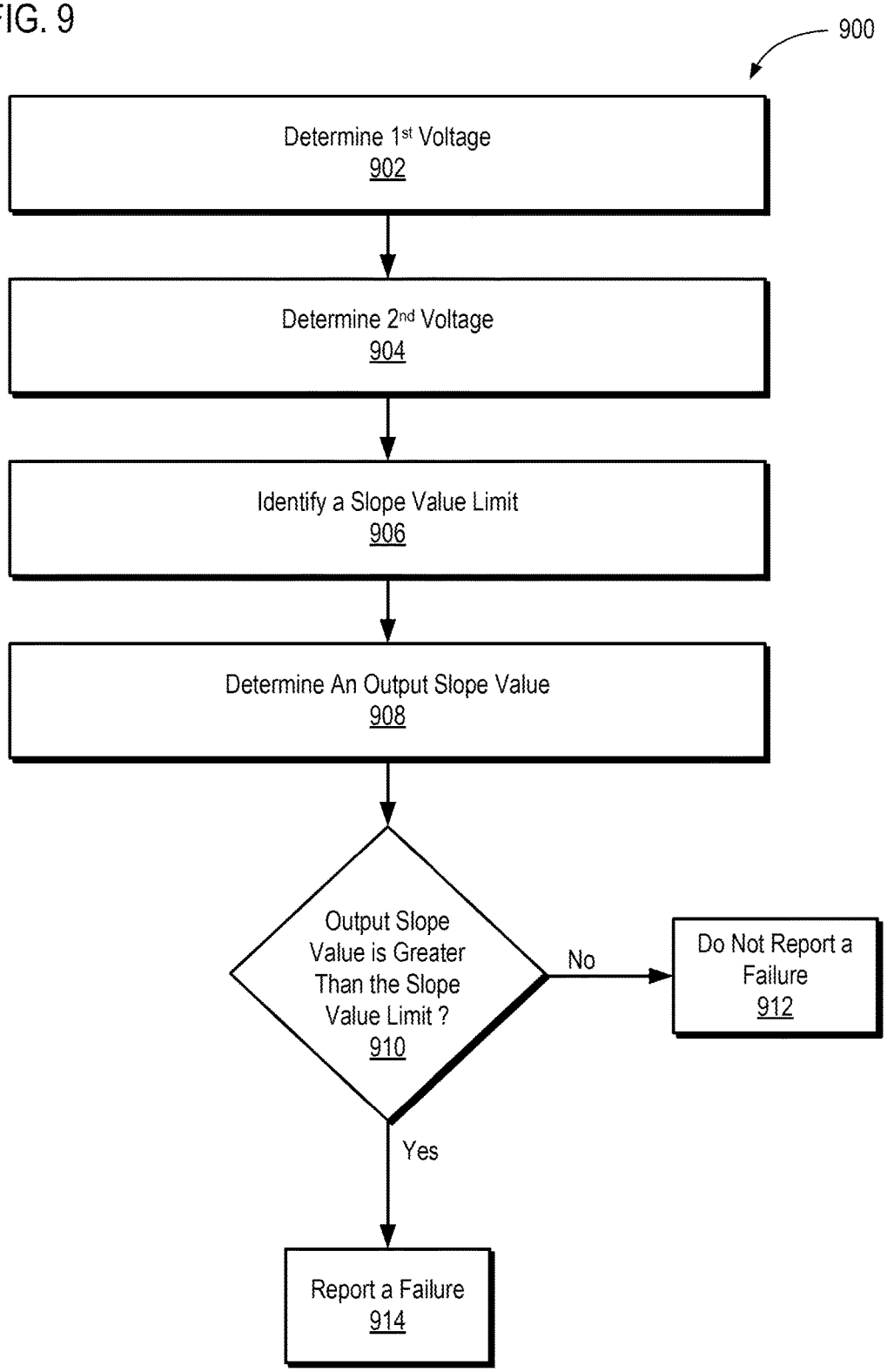
FIG. 9 illustrates a flow chart of one example of a method for identifying a failure in an analog to digital converter.

FIG. 9 is an outline of a method 900 to detect a failure of an A/D converter, according to one embodiment. A method 900 for detecting a failure of an A/D converter, according to one embodiment, may be implemented on a computing device. The method may include determining a first voltage 902 of A/D converter output. A computing device may be configured to determine the first voltage using a voltage meter or any other suitable measurement device. The determined first voltage may be an analog voltage and/or may be represented by a digital quantity. A computing device may be configured to store all relevant information of a determined first voltage as a digital quantity associated with the determined first voltage. The determined first voltage may include the time at which it was determined, and may include an amplitude of the determined first voltage.

The amplitude of the first voltage may be any value within a range of expected or possible voltage amplitude values. For example, for a given transmission system the amplitude of the first determined voltage may be expected to be between approximately negative 33 KV and positive 33 KV.

The method may include determining a second voltage 904 of an A/D converter output. A computing device may be configured to determine the second voltage 904. The determined second voltage 904 may be an analog voltage and may be represented by a digital quantity. The determined second voltage may include the time at which it was determined, and may include an amplitude of the determined second voltage. The amplitude of the second voltage may be any value within a range of expected or possible voltage amplitude values. The first determined voltage may be an output voltage value of an A/D converter output configured to be coupled with a computing device. The output of the A/D converter may be in electrical communication with a computing device. The A/D converter output may be configured to couple with a computing device through one or more suitable indirect means of electrical coupling. The determined first and second voltages may be output voltage values of one or more A/D converter outputs. The second determined voltage may be an output voltage according to the A/D converter output of a determined first voltage value. In other embodiments, the determined second voltage may correspond to an A/D converter other than the A/D converter of the determined first voltage.

The method may also include identifying a slope value limit 906 of the A/D converter, as described and defined herein. A computing device may be configured to determine a slope value limit associated with an output of an A/D converter. A determined slope value limit may be associated with a filter (e.g., the output of a filter) of an A/D converter. A slope value limit may include a slope value of a step response of the filter associated with the A/D converter.

For example, the step response of an A/D converter may include a maximum slope value, which may be greater than other slope values of the filter step response. In other embodiments, the slope value may be associated with more than one slope value of a filter step response. For example, a slope limit value may include an average or weighted average of one or more slope values of a filter step response associated with the A/D converter. The slope limit value may include a maximum output slope value, determined to be greater than any allowable output slope values of a properly functioning A/D converter. In other embodiments, a maximum output slope value may be an average output slope value. For example, an output slope of the output of a properly functioning A/D converter may commonly remain below a maximum output slope value configured to be an average output slope value.

The method may also include determining an output slope value 908 utilizing the determined first voltage and the determined second voltage. Determining the output slope value may include finding a difference between a determined first voltage value and a determined second voltage value. As described herein, the first voltage value may be determined at a first time and the second voltage value may be determined at a second time.

Determining an output slope value associated with an A/D converter may include determining a time between the first and second times associated with the first and second voltage values, respectively. The output slope value may be based on a suitable operation utilizing the difference of the determined first and second voltage values and the time between the first and second times of the voltage values. In some embodiments, the output slope value may be based on the magnitude of the difference of the two voltage values, divided by the magnitude of the time between the first and second times. In other embodiments, the output slope value may be based on another suitable operation which may be a specific mathematical calculation. For example, the output slope value may be based on an average change between several output values. In other embodiments, the output slope value may be based on a weighted average of several preliminary output slope values, each based on the difference between two voltage values and the time between each value.

In other embodiments, the output slope value may be based on the largest difference between any two voltage values, of several determined voltage values, with each determined voltage value being determined by an equal amount of time following another determined voltage value. The output slope value may be determined according to any suitable method, from a wide range of suitable methods utilizing one or more voltage values associated with the output of an over-sampling A/D converter.

The method may further include comparing a determined (e.g., measured or reported) output slope value with a determined or threshold slope value limit 910. Each of the determined output slope value and the determined slope value limit may be configured to at least roughly approximate a ratio of a change in voltage and a change in time. The comparison made by the computing device may be based upon the configuration of the slope value limit. The slope value limit may be a maximum of the slope values of the output of an A/D converter.

The slope value limit may be a minimum or any other any suitable characteristic, and the computing device may be configured to compare an output slope value with the slope value limit based on the configuration of the slope value limit. The slope value limit may include a maximum slope value, or a restriction on the possible slope values of the output of an A/D converter, with a slope value of the output only exceeding the slope value limit if the A/D converter includes a failure. For example, a slope value of the output of an A/D converter may be configured to include only slope values that are less than the slope value limit. Any slope value of the output of an A/D converter exceeding a slope value limit may imply a failure of the A/D converter. The method may include comparing an output slope value and a slope value limit that is configured to be a minimum slope value for all slope values of an output of an A/D converter. A computing device may be configured to determine a failure of the A/D converter, by comparing any determined output slope values with the determined slope value limit. In other embodiments, the method may include a computing device configured to determine a failure of an A/D converter based on a slope value limit.

Based on a comparison of a determined output slope value and a determined slope value limit, the method may include reporting a failure of an A/D converter. If a determined output slope value is greater than a determined slope value limit, a computing device may be configured to report a failure 914 (an error or anomaly) of an A/D converter. For example, a computing device may determine that a determined output slope value is greater than a slope value limit configured to be a maximum slope value of the output of an A/D converter. The computing device and/or IED may be configured to identify a failure of the A/D converter and may report the failure according to any suitable method.

For example, a computing device may be configured to report the failure of the A/D converter to a communication system coupled with the computing device. The computing device may be configured to illuminate one or more warning lights, and may indicate a failure of an A/D converter to a user with the one or more illuminated warning lights. In other embodiments, the computing device may be configured to terminate one or more processes and/or disable one or more components of a power system coupled with the computing device. However, the computing device may be configured to operate according to any suitable manner in response to one or more identified failures of an A/D converter.

If a determined output slope value is less than a determined slope value limit, a computing device may be configured to not report a failure 912 of an A/D converter and/or to report a positive (i.e., operational or normal) status. The computing device may be configured to communicate a status of one or more A/D converters to a communication system coupled with the computing device. The computing device may include one or more status lights to indicate when no failures have been detected in one or more A/D converters configured to couple with the computing device.

Figure 10:
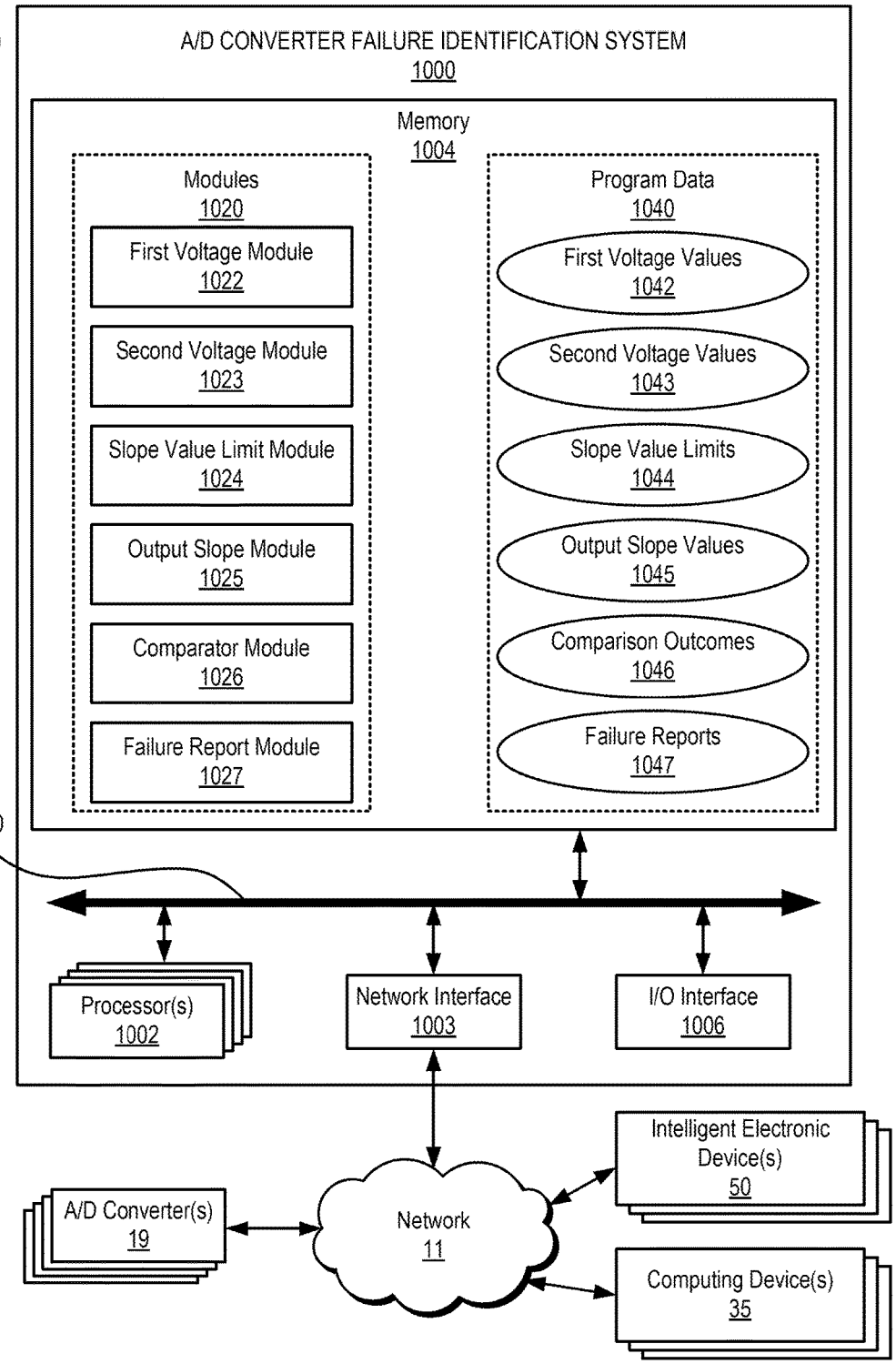
FIG. 10 illustrates one example of a system for identifying a failure in an analog to digital converter.

FIG. 10 is a system for identifying failures of an A/D converter, according to one embodiment. A system for identifying failures of an A/D converter 1000 may include a system bus 1010, one or more processors 1002, a memory 1004, an input/output interface 1006, and a network interface 1003. The memory 1004 may be in electrical communication with the one or more processors 1002, via a system bus 1010, to store program data 1040.

The one or more processors 1002 may include one or more general purpose devices, such as an Intel®, AMD®, or other standard microprocessor. The one or more processors 1002 may include a special purpose processing device, such as ASIC, SoC, SiP, FPGA, PAL, PLA, FPLA, PLD, or other customized or programmable device. The one or more processors 1002 may perform distributed (e.g., parallel) processing to execute or otherwise implement functionalities of the present embodiments. The one or more processors 1002 may run a standard operating system and perform standard operating system functions. It is recognized that any standard operating systems may be used, such as, for example, Microsoft® Windows®, Apple® MacOS®, Disk Operating System (DOS), UNIX, IRJX, Solaris, SunOS, FreeBSD, Linux®, ffiM® OS/2® operating systems, and so forth.

The memory 1004 may include static RAM, dynamic RAM, flash memory, one or more flip-flops, ROM, CD-ROM, DVD, disk, tape, or magnetic, optical, or other computer storage medium. The system bus 1010 may facilitate communication and/or interaction between the other components of the system, including the one or more processors 1002, the memory 1004, the input/output interface 1006, and the network interface 1003.

The modules 1020 may include all or portions of other elements of the system 1000. The program modules 1020 may run multiple operations concurrently or in parallel by or on the one or more processors 1002. Portions of the disclosed modules, components, and/or facilities are embodied as executable instructions embodied in hardware or in firmware, or stored on a non-transitory, machine-readable storage medium. The instructions may comprise computer program code that, when executed by a processor and/or computing device, cause a computing system to implement certain processing steps, procedures, and/or operations, as disclosed herein. The modules, components, and/or facilities disclosed herein, may be implemented and/or embodied as a driver, a library, an interface, an API, FPGA configuration data, firmware (e.g., stored on an EEPROM), and/or the like. Portions of the modules, components, and/or facilities disclosed herein are embodied as machine components, such as general and/or application-specific devices, including, but not limited to: circuits, integrated circuits, processing components, interface components, hardware controller(s), storage controller(s), programmable hardware, FPGAs, ASICs, and/or the like. Accordingly, the modules disclosed herein may be referred to as controllers, layers, services, engines, facilities, drivers, circuits, and/or the like.

The system memory 1004 may also include program data 1040. Data generated by the system 1000, such as by the modules 1020, may be stored on the system memory 1004, for example, as stored program data 1040. The stored program data 1040 may be organized as one or more databases.

The input/output interface 1006 may facilitate interfacing with one or more input devices and/or one or more output devices. The input device(s) may include a keyboard, mouse, touch screen, light pen, tablet, microphone, sensor, or other hardware with accompanying firmware and/or software. The output device(s) may include a monitor or other display, printer, speech or text synthesizer, switch, signal line, or other hardware with accompanying firmware and/or software.

The network interface 1003 of the system may be configured to communicate over a communication network with one or more computing devices. Program and/or module data may be received via the network interface, over a network from an appropriate device, such as a computing device, an IED, or a mobile computing device. The program data 1040 may be received as user input manually entered into a user interface of an appropriate IED or computing device. The program data may also be received from one or more A/D converters 19 through the network interface 1003, or through the input/output interface 1006. The program data 1040 may be received automatically from a data management system on an IED or computing device. The program data 1040 may be received over the network 11 as a file from an IED 50 or a computing device 35.

As noted, the system 1000 also includes various modules 1020 (or engines, elements, or components) to implement functionalities of the system 1000, including a first voltage module 1022, a second voltage module 1023, a slope value limit module 1024, an output slope value module 1025, a comparator module 1026, and/or a failure report and/or notification module 1027. These elements may be embodied, for example, at least partially in the program modules 1020.

In other embodiments, these elements may be embodied or otherwise implemented in hardware of the system 1000. The system 1000 may also include program data 1040 such as one or more first voltage values 1042, one or more second voltage values 1043, one or more slope value limits 1044, one or more output slope values 1045, one or more comparison outcomes 1046, and/or one or more failure reports 1047 that may be stored in the memory 1004, which may be generated, accessed, and/or manipulated by the modules 1020.

The first voltage module 1022 may be configured to determine a first voltage value associated with an analog voltage of an output of an A/D converter 19, at a first time. The first voltage module 1022 may be configured to store a first voltage value 1042 in the program data 1040. The first voltage value 1042 of the first voltage module 1022 may be based on the analog voltage of the A/D converter, and the first voltage value 1042 may include the first time at which the voltage was determined. The first voltage module 1042 may be configured to determine a first voltage value 1042 associated with an analog voltage of an output of an A/D converter 19 that may couple with the system 1000 through a network 11, and the network interface 1003, of the system 1000. In other embodiments, the first voltage module 1022 may determine the first voltage value 1042 associated with an analog voltage of an output of an A/D converter 19 that may couple with the system 1000 via the input/output interface 1006. The system 1000 may be further configured to store a first time at which a first voltage value 1042 may have been determined by the first voltage module 1022, with the first voltage value 1042.

The second voltage module 1023 may be configured to determine a second voltage value associated with an analog voltage of an output of an A/D converter 19, at a second time. The second voltage module 1023 may be configured to store a second voltage value 1043 in the program data 1040. The second voltage value 1043 of the second voltage module 1023 may be based on the analog voltage of the A/D converter, and the second voltage value 1043 may include the second time at which the voltage was determined. The second voltage module 1023 may be configured to determine a second voltage value 1043 associated with an analog voltage of an output of an over-sampling A/D converter 19 that may couple with the system 1000 through a network 11, and the network interface 1008, of the system 1000. In other embodiments, the second voltage module 1023 may determine the second voltage value 1043 associated with an analog voltage of an output of an A/D converter 19 that may couple with the system 1000 via the input/output interface 1006. The output of the A/D converter 19 associated with the determined second voltage value 1043 may be the same A/D converter 19 associated with a first voltage value 1042. The system 1000 may be further configured to store a second time at which a second voltage value 1043 may have been determined by the second voltage module 1023, with the second voltage value 1043. The system 1000 may be configured to determine a second voltage value 1043 at a second time, the second time being some determined amount of time after a first time of a first voltage value 1042.

The slope value limit module 1024 may be configured to determine a slope value limit associated with an output of an A/D converter. A determined slope value limit may be associated with a filter, and/or the output of a filter, of A/D converter. A slope value limit may include a slope value of a step response of the filter associated with the A/D converter. For example, the step response of an over-sampling A/D converter may include a maximum slope value, which may be greater than other slope value of the filter step response. The slope value may be associated with more than one slope value of a filter step response.

For example, a slope limit value may include an average or weighted average of one or more slope values of a filter step response associated with the A/D converter. The slope limit value may include a maximum output slope value, determined to be greater than any allowable output slope values of a properly functioning A/D converter. In other embodiments, a maximum output slope value may be an average output slope value. For example, an output slope of the output of an A/D converter without a failure may commonly remain below a maximum output slope value configured to be an average output slope value.

The output slope value module 1025 may be configured to determine one or more output slope values 1045 of the output of each A/D converter. An output slope value 1045 may be based on a difference of the first and second measured output voltages 1042, 1043 of an A/D converter. The difference of the first and second measured output voltages 1042, 1043 of an A/D converter may be determined according to any suitable method. For example, a first measured output voltage 1042 may be subtracted from a second measured output voltage 1043 of the same A/D converter. In other embodiments, a first measured output voltage 1042 of an A/D converter may be utilized with a second measured output voltage 1043 of another A/D converter to determine a difference of the first and second output voltages 1042, 1043. Still further embodiments may associate any suitable characteristic of a filter associated with an A/D converter 19 with the determination of the output slope value.

The difference may be scaled by any suitable scaling quantity. For example, the difference may be divided by an amount based on the time between a first and a second measured output voltages 1042, 1043. The resulting scaled difference may be configured to approximate and/or represent an output slope value 1045. In other embodiments, the difference may be multiplied by a number or divided by a number. In some embodiments, a number multiplying or dividing a difference may be based on an amount of time between the first and second measured output voltages 1042, 1043.

The comparator module 1026 may compare the determined output slope values 1045 and the slope value limits 1044 of the first and second A/D converters. The comparator module may identify a failure of the first and/or second A/D converters, if the determined output slope values 1045 from the first and second A/D converters are greater than one or more identified slope value limits 1044. The determined output slope value 1045 may be less than the identified slope value limit 1044 of either the first or second A/D converter. The comparator module 1026 may be configured to identify a non-failure, or may indicate that no failure of either A/D converter has been identified.

Based on an output of the comparator module 1026 the failure report and/or notification module 1027 may report a failure of an A/D converter. If a determined output slope value 1045 is greater than a determined slope value limit 1044, the failure report module may be configured to report a failure of an A/D converter. For example, the comparator module 1026 may determine that a determined output slope value 1045 is greater than a slope value limit 1044 configured to be a maximum slope value of the output of an A/D converter. The comparator module 1026 may identify a failure of the A/D converter, and the failure report module 1027 may report the failure according to any suitable method.

For example, the failure report module may be configured to report a failure of the A/D converter to a communication system coupled with the system 1000. The system 1000 may be configured to illuminate one or more warning lights, and may indicate a failure of an A/D converter with the one or more illuminated warning lights. The system 1000 may be configured to alter one or more processes, and/or configure one or more components of a power system coupled with the system 1000. However, the system 1000 may be configured to operate according to any suitable manner in response to one or more identified failures of an A/D converter. If a determined output slope value 1045 is less than a determined slope value limit 1044, the failure report module 1027 may be configured to not report a failure of an A/D converter. The failure report module 1027 may be configured to communicate a status of one or more A/D converters to a communication system coupled with the system 1000. The system 1000 may include one or more status lights to indicate when no failures have been detected in one or A/D converters configured to couple with the system 1000.

This disclosure has been made with reference to various embodiments, including the best mode. However, those skilled in the art will recognize that changes and modifications may be made to the embodiments without departing from the scope of the present disclosure. While the principles of this disclosure have been shown in various embodiments, many modifications of structure, arrangements, proportions, elements, materials, and components may be adapted for a specific environment and/or operating requirements without departing from the principles and scope of this disclosure. These and other changes or modifications are intended to be included within the scope of the present disclosure.

This disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element. The scope of the present invention should, therefore, be determined by the following claims:

What is claimed:

1. An intelligent electronic device (IED) configured to identify a failure in an analog to digital (A/D) converter, comprising:
    a meter configured to
        determine a first voltage of an output of a first A/D converter at a first time, $t_1$, and
        determine a second voltage of the output of the first A/D converter at a second time, $t_2$;
    a slope value limit module configured to identify a slope value limit corresponding to a slope of a step response of a filter associated with the A/D converter;
    an output slope value module configured to determine an output slope value corresponding to a slope of the output of the first A/D converter based on a difference, $d_1$, of the first voltage at the first time, $t_1$, and the second voltage at the second time, $t_2$;
    a comparator module configured to determine that the output slope value is greater than the slope value limit; and
    an error reporting module configured to report a failure of the A/D converter based on the determination that the output slope value is greater than the slope value limit.

2. The IED of claim 1, wherein the slope value limit corresponding to the slope of the step response of the filter associated with the A/D converter is a maximum slope value.

3. The IED of claim 1, wherein the slope value limit corresponding to the slope of the step response of the filter associated with the A/D converter comprises a slope value smaller than a maximum slope value.

4. The IED of claim 1, wherein the slope value limit corresponds to the slope of an input forcing function of the filter associated with the A/D converter, the input forcing function comprising a first step function at the first time $t_1$ followed by a second step function of opposite sign at the second time $t_2$.

5. The IED of claim 1, wherein the slope value limit corresponds to a slope of an impulse response of a filter associated with the A/D converter.

6. The IED of claim 1, wherein the slope value limit corresponds to a slope of a plurality of combined impulse responses of at least one filter associated with the A/D converter.

7. The IED of claim 1, wherein the filter associated with the A/D converter comprises at least one sinc filter.

8. The IED of claim 1, wherein the filter associated with the A/D converter comprises at least one digital filter.

9. The IED of claim 1, wherein the filter associated with the A/D converter comprises at least one analog filter.

10. The IED of claim 1, wherein the slope of the filter step response is defined by samples at a time interval equal to the difference between first time $t_1$ and second time $t_2$.

11. The IED of claim 1, wherein the slope of the filter step response of the filter associated with the A/D converter is defined by samples at a time interval larger than the difference between first time $t_1$ and second time $t_2$.

12. The IED of claim 1, wherein the meter comprises at least one digital measurement device.

13. The IED of claim 1, wherein the output slope value corresponds to a mathematical combination of multiple consecutive output voltages of the first A/D converter $t_1$, $t_2$, $t_3$ up to $t_n$, where n is an arbitrarily large integer.

14. The IED of claim 1, wherein the output slope value corresponds to a magnitude of a combination of the slope of the output of the first A/D converter based on the difference, $d_1$, of the first voltage at the first time, $t_1$, and the second voltage at the second time, $t_2$, and a second slope of the output of the first A/D converter based on a difference, $d_2$, of a third voltage at a third time, $t_3$, and a fourth voltage at a fourth time, $t_4$.

15. The IED of claim 1, wherein the A/D comprises a delta-sigma A/D converter.

16. The IED of claim 1, wherein the A/D converter comprises a successive approximation register A/D converter.

17. A non-transitory computer-readable medium having instructions that, when executed by a processor, cause the processor to perform operations for identifying a failure in an analog to digital (A/D) converter, the operations comprising:
    determining a first voltage of an output of a first A/D converter at a first time, $t_1$;
    determining a second voltage of the output of the first A/D converter at a second time, $t_2$;

identifying a slope value limit corresponding to a slope of a step response of a filter associated with the A/D converter;

determining an output slope value corresponding to a slope of the output of the first A/D converter based on a difference, $d_1$, of the first voltage at the first time, $t_1$, and the second voltage at the second time, $t_2$;

determining that the output slope value is greater than the slope value limit; and reporting a failure of the A/D converter based on the determination that the output slope value is greater than the slope value limit.

18. A method for identifying a failure in an analog to digital (A/D) converter, comprising:

determining a first voltage of an output of a first A/D converter at a first time, $t_1$;

determining a second voltage of the output of the first A/D converter at a second time, $t_2$;

identifying a slope value limit corresponding to a slope of a step response of a filter associated with the A/D converter;

determining an output slope value corresponding to a slope of the output of the first A/D converter based on a difference, $d_1$, of the first voltage at the first time, $t_1$, and the second voltage at the second time, $t_2$;

determining that the output slope value is greater than the slope value limit; and reporting, via a communication link, a failure of the A/D converter based on the determination that the output slope value is greater than the slope value limit.

19. The method of claim 18, wherein the slope value limit corresponding to the slope of the step response of the filter associated with the A/D converter comprises a maximum slope value.

20. The method of claim 18, wherein the slope of the filter step response is defined by samples at a time interval equal to the difference between first time $t_1$ and second time $t_2$.

21. The method of claim 18, wherein the slope of the filter step response of the filter associated with the A/D converter is defined by samples at a time interval larger than the difference between first time $t_1$ and second time $t_2$.

22. The method of claim 18, wherein the output slope value corresponds to a magnitude of a combination of the slope of the output of the first A/D converter based on the difference, $d_1$, of the of the first voltage at the first time, $t_1$, and the second voltage at the second time, $t_2$, and a second slope of the output of the first A/D converter based on a difference, $d_2$, of a third voltage at a third time, $t_3$, and a fourth voltage at a fourth time, $t_4$.

23. The method of claim 18, wherein the A/D comprises a delta-sigma A/D converter.

* * * * *